United States Patent
Haraguchi et al.

(10) Patent No.: US 7,433,251 B2
(45) Date of Patent: * Oct. 7, 2008

(54) SEMICONDUCTOR MEMORY DEVICE STORING REDUNDANT REPLACEMENT INFORMATION WITH SMALL OCCUPATION AREA

(75) Inventors: Masaru Haraguchi, Hyogo (JP); Takeshi Fujino, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/765,551

(22) Filed: Jun. 20, 2007

(65) Prior Publication Data

US 2007/0242506 A1 Oct. 18, 2007

Related U.S. Application Data

(63) Continuation of application No. 10/372,284, filed on Feb. 25, 2003, now Pat. No. 7,254,069.

(30) Foreign Application Priority Data

Jul. 30, 2002 (JP) .............................. 2002-221763

(51) Int. Cl.
*G11C 7/00* (2006.01)
*G11C 8/00* (2006.01)

(52) U.S. Cl. ............... 365/200; 365/225.7; 365/230.03; 365/230.96

(58) Field of Classification Search .................. 365/200, 365/225.7, 230.03, 230.06
See application file for complete search history.

(56) References Cited

U.S. PATENT DOCUMENTS 4,389,715 A   6/1983   Eaton, Jr. et al.
5,268,866 A   12/1993  Feng et al.
5,339,344 A   8/1994   Kimura et al.
5,548,553 A   8/1996   Cooper et al.
5,627,786 A   5/1997   Roohparvar
5,742,547 A   4/1998   Lee
5,787,043 A   7/1998   Akioka et al.
5,798,974 A   8/1998   Yamagata
5,808,948 A   9/1998   Kim et al.
5,859,801 A   1/1999   Poechmueller
5,973,990 A   10/1999  Sakurai
6,094,382 A   7/2000   Choi et al.
6,115,301 A   9/2000   Namekawa
6,178,124 B1  1/2001   Kaiser et al.

(Continued)

FOREIGN PATENT DOCUMENTS

JP      06-044796       2/1994

(Continued)

*Primary Examiner*—Trong Phan
(74) *Attorney, Agent, or Firm*—Leydig, Voit & Mayer, Ltd.

(57) ABSTRACT

Column redundancy data storage circuit blocks storing column redundancy data for repairing defective columns are arranged in correspondence to memory cell array blocks, respectively. The storage data of the column redundancy data storage circuits is transferred to redundancy data hold circuits arranged in spare column decoder bands adjacent to the data paths for transferring internal data, and are decoded for selection of a page in the spare decoder bands in column access. Therefore, it is possible to reduce the occupation area of a fuse program circuit which programs redundancy data for repairing a defective column.

3 Claims, 23 Drawing Sheets

U.S. PATENT DOCUMENTS

| | | |
|---|---|---|
| 6,246,620 B1 | 6/2001 | Fujioka et al. |
| 6,269,035 B1 | 7/2001 | Cowles et al. |
| 6,281,719 B1 | 8/2001 | Ho et al. |
| 6,333,877 B1 | 12/2001 | Nagaoka et al. |
| 6,414,887 B2 | 7/2002 | Koshikawa |
| 6,438,044 B2 | 8/2002 | Fukuda |
| 6,473,352 B2 | 10/2002 | Nishino et al. |
| 6,594,177 B2 | 7/2003 | Matarrese et al. |
| 6,687,170 B2 | 2/2004 | Zimmerman et al. |
| 6,771,555 B2 | 8/2004 | Kang |
| 6,788,599 B2 | 9/2004 | Yoon |
| 7,061,800 B2 | 6/2006 | Ooishi |

FOREIGN PATENT DOCUMENTS

| | | |
|---|---|---|
| JP | 11-250688 | 9/1999 |
| JP | 2000-182394 | 6/2000 |
| JP | 2002-141475 | 5/2002 |

SEMICONDUCTOR MEMORY DEVICE STORING REDUNDANT REPLACEMENT INFORMATION WITH SMALL OCCUPATION AREA

BACKGROUND OF THE INVENTION

1. Field of the Invention

The present invention relates to a semiconductor memory device, and more particularly to an arrangement of a redundant information storage unit for storing redundant information for specifying a defective memory cell and used for repairing the defective memory cell through replacement with a redundant cell, and a configuration for reading redundant information. More specifically, the present invention relates to arrangement of a redundancy data storage unit in an embedded memory integrated in the same semiconductor substrate with a logic circuit.

2. Description of the Background Art

FIG. 25 schematically shows an entire configuration of a conventional semiconductor memory device. In FIG. 25, the semiconductor memory device includes two memory arrays MAE and MAW. Memory array MAE is divided into memory cell array blocks MBE0 to MBE7 by sense amplifier bands SABE1 to SABE7. Sense amplifier bands SAB0 and SABE8 are arranged outside memory cell array blocks MBE0 and MBE7, respectively.

Memory array MAW is also divided into memory cell array blocks MBW0 to MBW7 by sense amplifier bands SABW1 to SAGW7. Sense amplifier bands SABW0 and SABW8 are arranged outside memory cell array blocks MBW0 and MBW7, respectively.

In each of memory cell array blocks MBE0 to MBE7 and MBW0 to MBW7, memory cells are arranged in rows and columns. In each of sense amplifier bands SABE0 to SABE8 and SABW0 to SABW8, sense amplifiers are arranged in correspondence to the columns in corresponding memory cell array blocks. The sense amplifiers are shared by the memory cell array blocks on both sides in a column extending direction (hereinafter, referred to as the column direction).

A decoder band DBD is disposed in the region between memory arrays MAE and MAW. Decoder band DBD is divided into decoder blocks DEB0 to DEB7 in correspondence to the memory cell array blocks. Each of decoder blocks DEB0 to DEB7 includes a row decoder for selecting a row and a column decoder for selecting a column.

In each of memory cell array blocks MBE0 to MBE7 and MBW0 to MBW7, word lines WL are arranged in correspondence to memory cell rows, and bit line pairs (not shown) are arranged in correspondence to the memory cell columns. The word line corresponding to an addressed row in a selected memory cell array block is driven to a selected state by the row decoder. When a corresponding memory cell array block is in a selected state, the column decoder selects a plurality of columns (bit line pairs) concurrently according to a column address signal. Column selection signal lines are extended along a row extending direction (hereinafter, referred to as the row direction).

In each of memory cell array blocks MBE0 to MBE7 and MBW0 to MBW7, a spare row is arranged for repairing a defective row. To repair a defective row, a row fuse circuit which stores a defective row address is provided in each of decoder blocks DEB0 to DEB7.

On the other hand, each of memory arrays MAE and MAW is provided with 64 pairs of I/O lines (data lines) and one spare data line. FIG. 25 shows, as a representative, a pair of I/O lines GIO in memory array MAE.

In correspondence to one pair of I/O lines, 16-bit bit line pairs are provided, for example.

In the operation of selecting a column, 64-bit memory cells are selected in the selected memory cell array block and connected to the corresponding I/O line pairs and a total of 128 bit data is transferred. A pair of spare I/O lines is used to repair a defective row in a unit of I/O line pair. These I/O line pairs GIO are arranged, in each of memory arrays MAE and MAW, extending over the memory cell array blocks in the column direction.

Data path bands DPE and DPW are arranged in correspondence to memory arrays MAE and MAW, respectively. I/O line pairs GIO are coupled to the corresponding data path bands DPE and DPW. Data path bands DPE and DPW each include a redundant replacement circuit for I/O replacement, a write driver/preamplifier for writing/reading internal data, and an input/output buffer circuit.

Each of data path bands DPE and DPW further include a column fuse circuit for storing redundancy data for repairing a defective column through I/O replacement. The column fuse circuits disposed in data path bands DPE and DPW store redundancy data of individual memory array blocks MBE0 to MBE7 and MBW0 to MBW7, Individual redundant replacement for each memory cell array block improves the repairing efficiency in redundant replacement.

In the memory array configuration shown in FIG. 25, in selecting a row, two memory cell array blocks are driven to a selected state in parallel in each of memory arrays MAE and MAW. Specifically, in memory array MAE, two memory cell array blocks are selected at the same positions in lower memory cell array blocks MBE0 to MBE3 and in upper memory cell array blocks MBE4 to MBE7, respectively. Also in memory array MAW, one memory cell array block is selected in lower memory cell array blocks MBW0 to MBW3 and the other memory cell array block is selected a the same position in upper memory cell array blocks MBW4 to MBW7. For example, memory cell array blocks MBW3 and MBW7 are selected at the same time.

A central control band CCTB is disposed in the region between data path bands DPE and DPW. Central control band CCTB includes a main control circuit, an input circuit for address signals and control signals, and a predecode circuit for row addresses. The selection of rows and columns are performed in units of memory cell array blocks under control of the main control circuit disposed in the central control band.

FIGS. 26 and 27 schematically show the structure of redundant replacement for repairing a defective column. In FIGS. 26 and 27, memory cell array blocks MB1 and MB0 are shown representatively. Memory cell array blocks MB0 and MB1 may be included in either one of memory arrays MAE and MAW shown in FIG. 25. Each memory cell array is provided with 64 pairs of I/O lines I/O<0> to I/O<63>. For the 64 pairs of I/O lines I/O<63:0>, a pair of spare I/O lines SI/O is arranged.

Data path band DP includes a shift switch circuit SHT which selectively connects a spare I/O line pair SI/O and I/O line pairs I/O<0:63> with internal data line pairs DB<0:63>. Shift switch circuit SHT disconnects an I/O line pair coupled to a defective memory cell from the internal data bus line pair under control of a shift control signal, not shown, and then connects the spare I/O line pair and the remaining I/O line pairs with the 64-bit internal data path line pairs. Shift switch circuit SHT switches the transfer route of the output signals of a preamplifier and a write driver at the time of accessing the defective cell.

It is assumed that as shown in FIG. 26, there is a defective memory cell MCa to be coupled to I/O line pairs I/O<0> on word line WLa in memory cell array block MB0. In this case, in selecting a column in shift switch circuit SHT, spare I/O line pair SI/O is connected to internal data line pair DB<0> while isolating I/O line pair I/O<0> from the corresponding internal data bus line pair DB<0>. I/O line pairs I/O<1> to I/O<63> are coupled to internal data line pairs DB<1> to DB<63>, respectively. As a result, defective memory cell MCa is replaced by the memory cell coupled to spare I/O line pair SI/O.

Decoder block DEB0 includes a column decoder, and the column selection lines from the column decoder are arranged along the row direction, similarly to word lines WL. Word line WLa is extended in the row direction in each of memory cell array block MB0 and MB1. Therefore, in selecting memory cell array block MB0, a normal memory cell and a spare memory cell are selected at the same time. Column selection by the column decoder enables spare memory cell data to be read to spare I/O line pair SI/O in parallel with the transfer of normal memory cell data in reading data.

It is assumed that memory cell array block MB1 is selected and word line WLb is selected as shown in FIG. 27. In memory cell array block MB1, there is a defective memory cell MCb arranged in correspondence to I/O line pair I/O<1> on the selected word line WLb. In this case, in selecting a column, connection paths are switched in shift switch circuit SHT so as to disconnect I/O line pair I/O<1> from internal data bus line pair DB<1>. Spare I/O line pair SI/O and I/O line pair I/O<0> are connected to internal data line pairs DB<0> and DB<1>, respectively. The remaining I/O line pairs I/O<2: 63> are connected to internal data bus line pairs DB<2> to DB<63>, respectively. As a result, defective memory cell MCb is replaced by the spare memory cell.

Therefore, where a column operation (data read or data write; column access) is performed after an ACT operation (row access) to select a row in a memory cell array block, it is determined on which memory cell array block the column operation is performed using the row-related address and the column-related address. Then, a column redundant fuse set is selected from among a total of eight column redundant fuse sets arranged in one-to-one correspondence to the memory cell arrays according to the determination result, so as to perform redundant replacement based on the redundancy data. The row address specifies two memory cell array blocks, and the column address specifies one of the two memory cell array blocks selected at the same time.

In a logic merged memory, the specification of the logic differs depending on a user's application, and different users make different demands on the specification of an embedded memory. Therefore, embedded memory is required to be developed into various kinds of products with the process of the same generation. Specifically, various memory cell array configurations are needed according to requests by the users with respect to the memory capacity, the number of banks) the number of pages, and the number of I/Os (data bit width), for example. Generally, the logic merged memory have the circuitry formed on the assumption that a number of memory cell array blocks are arranged so as to accommodate requests for various kinds of memory cell array configurations. In the present example, the circuit is formed standing on the assumption that 32 memory cell array blocks are arranged at the maximum.

Therefore, it is also necessary that the column fuse sets arranged in data path band DP are provided corresponding to the maximum number of memory cell array blocks. Consequently, in the present example, 32 column fuse sets are arranged.

FIG. 28 schematically shows the arrangement of the column fuse sets. In FIG. 28, data path band DP includes a read circuit arrangement region RKT where a read circuit including a preamplifier is arranged, a write driver arrangement region WKT where a write driver is arranged, and a fuse set arrangement region (band) FB disposed between read circuit arrangement region RKT and write circuit arrangement region WKT.

Fuse set band FB has 32 redundancy data storage circuits FU0 to FU31 arranged, so as to be able to accommodate the maximum number of memory cell arrays. Redundancy data storage circuits FU0 to FU32 each include 7-bit fuse elements and a read circuit that reads fuse programmed data. The 7-bit redundancy data is used because 6 bits are used to select one from 64 I/O line pairs and 1 bit is used to indicate whether redundant replacement is performed or not.

The output signals of redundancy data storage circuits FU0 to FU32 are applied to a shift decoder 910 disposed in a column spare decoder band CSPDB. Shift decoder 910 decodes the applied 7-bit redundancy data and generates spare signals SFTR and SFTW that set the connection path of shift switch circuit SHT shown in FIGS. 26 and 27. Spare signal SFTR sets the output data transfer path of the read circuit including the preamplifier, and spare signal SFTW sets the write data transfer path of the write circuit including the write driver. The separated IO structure is assumed where the internal read data and write data are transferred via separately arranged data lines. When internal write data and internal write data are transferred via the common internal data lines such as I/O lines, a shift control signal of one kind is used.

Spare signals SFTR and SFTW from shift decoder 910 each include signals of 64 bits and set connection paths for 64 I/Os and a spare I/O. As for the shifting operation, two switch circuits for each I/O line pair are arranged and one of the two switch circuits is set conductive in accordance with the shift control signal, thereby establishing the connection path.

Central control band CCTB includes a fuse selection decoder 900 in order to select redundancy data storage circuits FU0 to FU31 disposed in fuse set band FB. Fuse selection decoder 900 is supplied with a row address bit RAB and a column address bit CAB. Row address bit RAB specifies a selected memory cell array block, and the column address bit specifies one of the two memory cell array blocks selected at the same time. Fuse read circuits disposed in redundancy data storage circuits FU0 to FU31 are selected in accordance with a fuse selection trigger signal FTRG from fuse election decoder 900, and the programmed redundancy data is read by the corresponding fuse set and applied to shift decoder 910.

As described above, redundancy data storage circuits FU0 to FU31 each include fuse elements of 7 bits. Fuse elements occupy larger area than transistors and are arranged with some margin in order to prevent scattered fragment generated during blowing from damaging other circuit(s). Therefore, fuse set band FB occupies relatively large area. Since an energy ray such as a laser ray is used for the programming of the elements, it is impossible to arrange interconnection lines above the fuse elements.

Fuse set band FB includes 32 redundancy data storage circuits FU0 to FU31 in correspondence to the largest available number of memory cell arrays. However, in the practical use, when the number of memory cell array blocks to be used is 8, for example, the remaining 24 sets of redundancy data storage circuits are unnecessary. Therefore, when the number of memory cell array blocks is small, useless redundancy data storage circuits are arranged, which causes the problem that the chip area cannot be reduced according to the number of memory cell array blocks, making it impossible to reduce the cost.

There is another problem that interconnection cannot be made efficiently because the fuse elements hinder interconnection layout.

There is still another problem that the number of fuse elements would be restricted if interconnection is made, making it impossible to increase repairing efficiency.

SUMMARY OF THE INVENTION

An object of the present invention is to provide a semiconductor memory device capable of changing an occupation area of a redundancy data storage circuit according to the number of memory cell array blocks.

Another object of the present invention is to provide a semiconductor memory device with a minimum number of redundancy data storage circuits.

A semiconductor memory device according to a first aspect of the present invention includes: a plurality of memory array blocks each having a plurality of memory cells arranged in rows and columns; and a plurality of redundancy data storage circuits, distributedly arranged physically corresponding to the memory array blocks, each for individually storing redundancy data that specify a defective column of the corresponding memory array block.

A semiconductor memory device according to a second aspect of the present invention includes: a plurality of memory array blocks each having a plurality of memory cells arranged in rows and columns; a plurality of redundancy data storage circuits, arranged physically corresponding to the memory array blocks, each for individually storing redundancy data that specify a defective row and a defective column of a corresponding memory array block; a plurality of redundancy data hold circuits, arranged physically corresponding to the memory array blocks, each for individually storing redundancy data specifying a defective row and a defective column of the corresponding memory array block; a redundancy transfer circuit for transferring redundancy data between the redundancy data storage circuits and the redundancy data hold circuits; and a transfer control circuit for controlling the transfer operation of the redundancy transfer circuit upon initializing of internal circuitry.

When redundancy data storage circuits are arranged physically corresponding to the memory array blocks, only the redundancy data storage circuits necessary for the memory cell array blocks actually arranged can be arranged, eliminating the arrangement of excess redundancy data storage circuits, which can reduce the area occupied by the redundancy data storage circuits.

Redundancy data storage circuits and redundancy data hold circuits are arranged physically corresponding to the memory array blocks, and in the initializing operation, redundancy data are transferred from the redundancy data storage circuits to the redundancy data hold circuits, making useless redundancy data storage circuits unnecessary. In addition, transferring redundancy data in the initialization makes it possible to eliminate the need for a special operation sequence for redundancy data transfer, thereby efficiently initializing the internal states.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
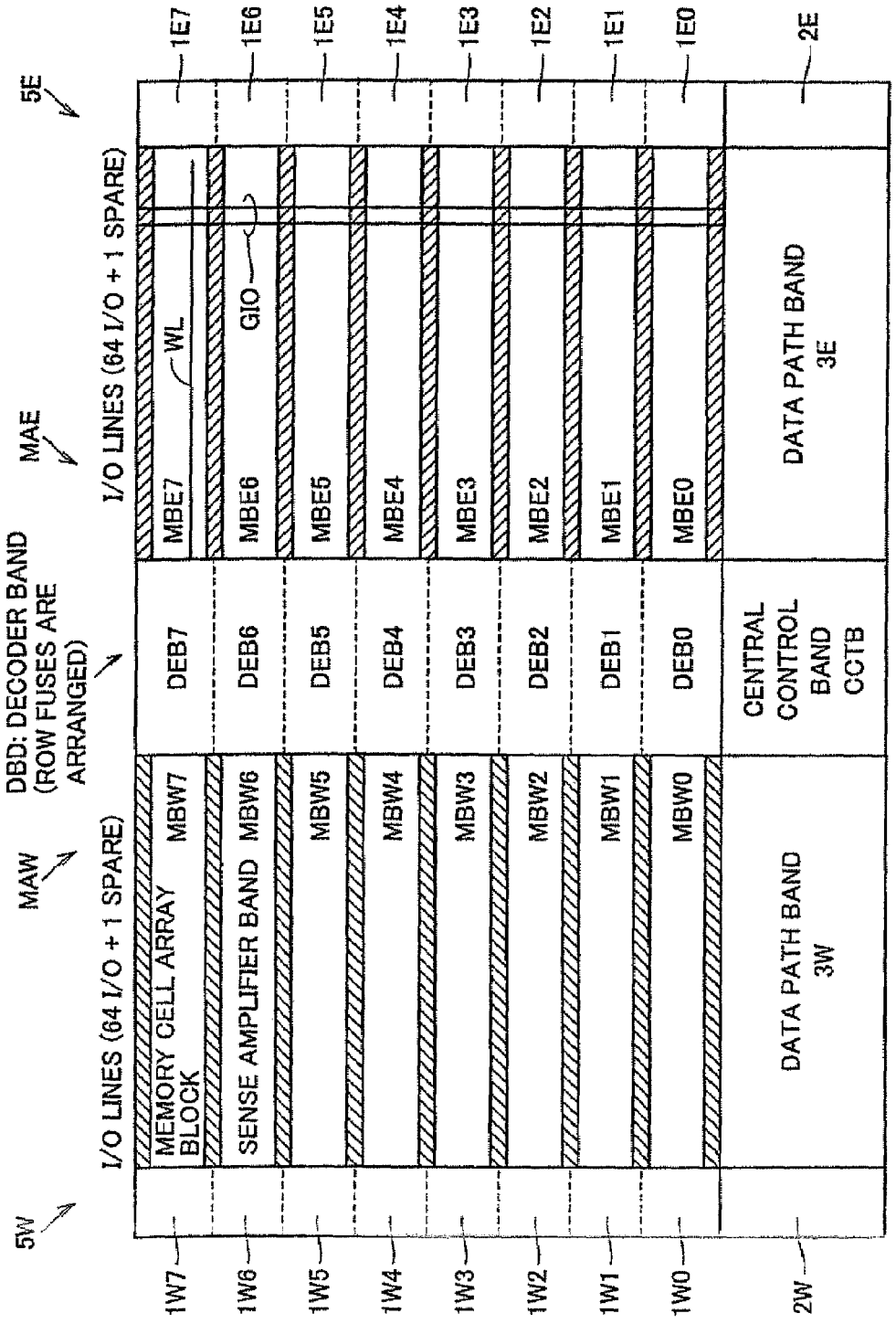
FIG. 1 schematically shows a configuration of a semiconductor memory device according to a first embodiment of the present invention.

FIG. 1 schematically shows an entire configuration of a semiconductor memory device according to a first embodiment of the present invention. In FIG. 1, the semiconductor memory device includes two memory arrays MAW and MAE, and a decoder band DBD arranged between memory arrays MAW and MAE. Memory array MAW is divided into memory cell array blocks MBW0 to MBW7 by sense amplifier bands, and memory array MAE is divided into memory cell array blocks MBE0 to MBE7 by sense amplifier bands. In FIG. 1 the sense amplifier bands are indicated by shadowed blocks.

In decoder band DBD, decoder blocks DEB0 to DEB7 are arranged in correspondence to memory cell array blocks MBW0 and MBE0 to MBW7 and MBE7. In each of data blocks DEB0 to DEB7, a row decoder and a column decoder are provided, and a row fuse program circuit for storing redundancy data to select a spare column is arranged.

In each of memory arrays MAE and MAW, 64 pairs of I/O lines GIO and a pair of spare I/O lines are arranged.

In a column fuse band 5W disposed outside memory array MAW, fuse blocks 1W0 to 1W7 which store column redundancy data are arranged in correspondence to memory cell array blocks MBW0 to MBW7. In a column fuse band 5E disposed outside memory array MA, fuse blocks 1E0 to 1E7 are arranged in correspondence to memory cell array blocks MBE0 to MBE7, respectively.

In each of fuse blocks 1W0 to 1W7 and 1E0 to 1E7, the redundancy data of the corresponding memory array block are stored, and in order to store and transfer the redundancy data, there are provided a 7-bit fuse program circuit, a read circuit for reading data of the fuse program circuit, and a transfer drive circuit for transferring selected redundancy data read by the read circuit. 7-bit fuse program circuit includes a 1-bit fuse element indicative of the use or non-use of spare column and fuse element of 6 bits for specifying one of the 64 I/O line pairs.

Data path bands 3W and 3E are arranged in correspondence to memory arrays MAW and MAE, respectively. No column fuses are arranged in data path bands 3W and 3E. A write/read circuit and a shift switch circuit for switching I/O line pairs are arranged.

Spare decoder bands 2W and 2E are arranged outside data path bands 3W and 3E. Column spare decoder band 2W is supplied with redundancy data sent from fuse blocks 1W0 to 1W7 included in column fuse band 5W. In the same manner, spare decoder band 2E is supplied with the redundancy data of fuse blocks 1E0 to 1E7 arranged in column fuse band 5E.

Similarly to the conventional case, a central control band CCTB is disposed between data path bands 3W and 3E.

Providing column fuse bands 5W and 5E outside memory arrays MAW and MAE makes it possible to arrange fuse blocks 1W0 to 1W7 and 1E0 to 1E7 without affecting the internal interconnection of memory cell arrays MAW and MAE. It is also possible to arrange fuse elements without taking the layout of the internal interconnection into consideration, thereby increasing the number of fuse elements, and arranging the fuse elements efficiently.

Arranging fuse blocks 1W0 to 1W7 and 1E0 to 1E7 in correspondence to memory cell array blocks MBW0 to MBW7 and ME0 to MBE7 makes it possible to arrange the fuse blocks actually used with no non-used fuse block, thereby reducing the occupation area of fuse blocks.

Figure 2:
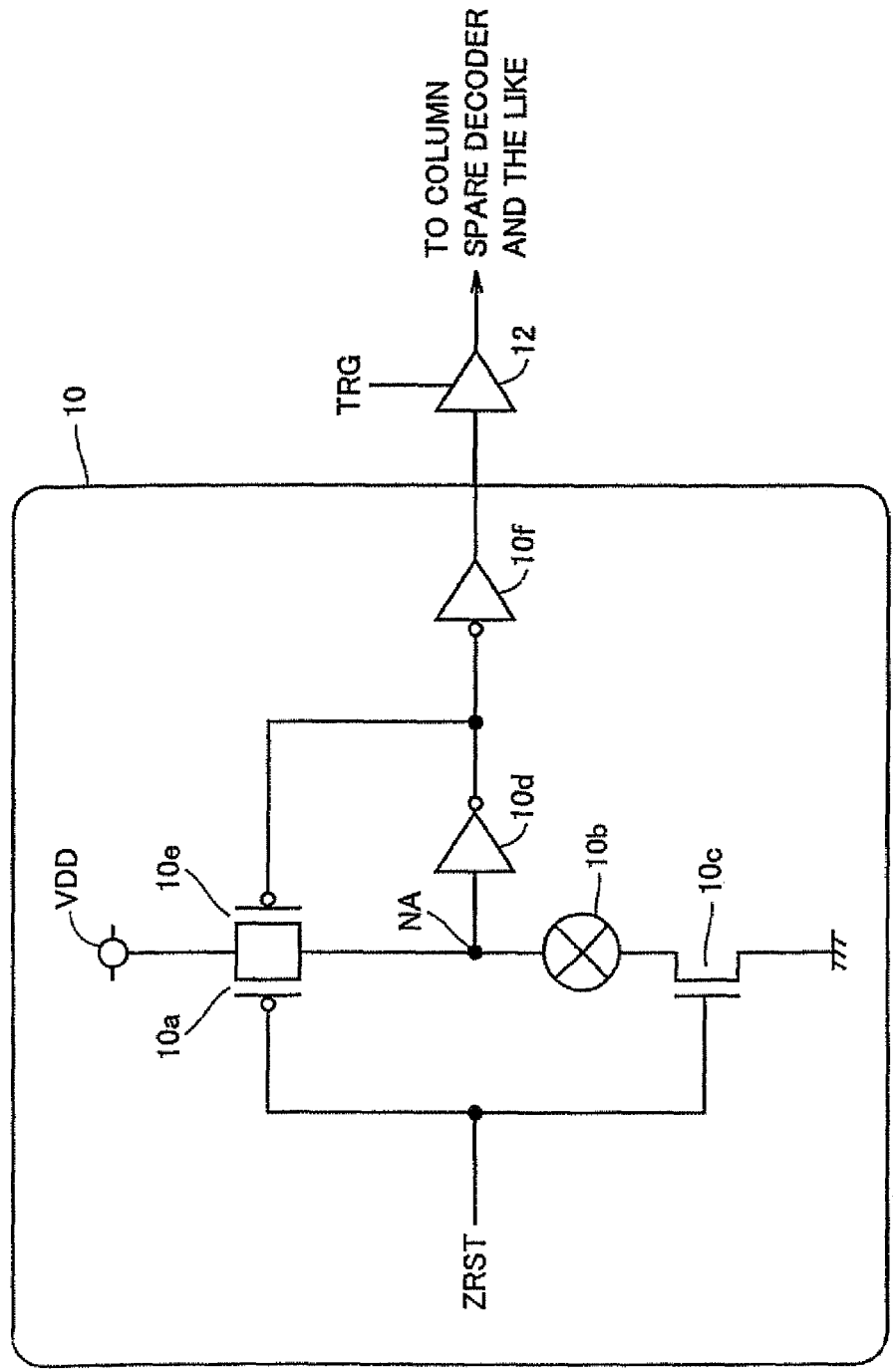
FIG. 2 shows an example of a configuration of a fuse read circuit used in the first embodiment of the present invention.

FIG. 2 shows an example of the 1-bit configuration of the fuse read circuits arranged in fuse blocks 1W0 to 1W7 and 1E0 to 1E7. In FIG. 2, a 1-bit fuse read circuit 10 includes a P-channel MOS transistor 10a that is rendered conductive in response to activation of a reset signal ZRST and transmits a power supply voltage VDD to a node NA when conductive; a fuse element 10b that is coupled to node NA; an N-channel MOS transistor 10c that is connected between fuse element 10b and a ground node and receives reset signal ZRST at a gate thereof; an inverter 10d that inverts the signal of node NA; a P-channel MOS transistor 10e that is selectively rendered conductive in accordance with the output signal of inverter 10d and transmits power supply voltage VDD to node NA when conductive; and an inverter 10f that inverts the output signal of inverter 10d.

Reset signal ZRST is set logical low (at L level) in initialization at power up or at the time of the system resetting.

Fuse element 10b may be a link element fusible by an energy ray such as a laser ray, and is made of aluminum fuse, for example.

In the fuse block, as a transfer circuit, a tri-state buffer 12 is provided to be selectively activated in response to a trigger signal TRG to transmit the output signal of fuse read circuit 10 to the hold circuit in the spare decoder band. The configuration shown in FIG. 2 is provided by 7 bits in parallel, and the individual fuse elements are selectively blown in accordance with the redundancy data to be stored.

In fuse read circuit 10, reset signal ZRST is set to L level for a predetermined period of time when the semiconductor memory device is started. Responsively, MOS transistor 10a is made conductive and MOS transistor 10c is made non-conductive, node NA is precharged to the power supply voltage VDD level, regardless of the state of the fuse element. In this precharged state, the output signal of inverter 10d is at L level and MOS transistor 10e is made conductive.

When reset signal ZRST returns to H level after the predetermined period of time, N-channel MOS transistor 10c is rendered conductive. If fuse element 10b is in non-blown state, MOS transistor 10e has a current driving capability small enough and node NA is discharged to the ground voltage level by fuse element 10b and MOS transistor 10c, and the output signal of inverter 10d attains H level, and accordingly the output signal of inverter 10f attain L level. On the other hand, when use element 10b is blown, node NA maintains the precharged state, and the output signal of inverter 10d is kept at L level, and accordingly, MOS transistor 10e maintains the conductive state, and node NA is held at the power supply voltage VDD level. In this state, the output signal of inverter 10f is set to H level.

The try-state buffer 12 is activated by trigger signal TRG when the corresponding memory cell array is selected, and transfers programmed redundancy data to fuse read circuit 10.

Figure 3:
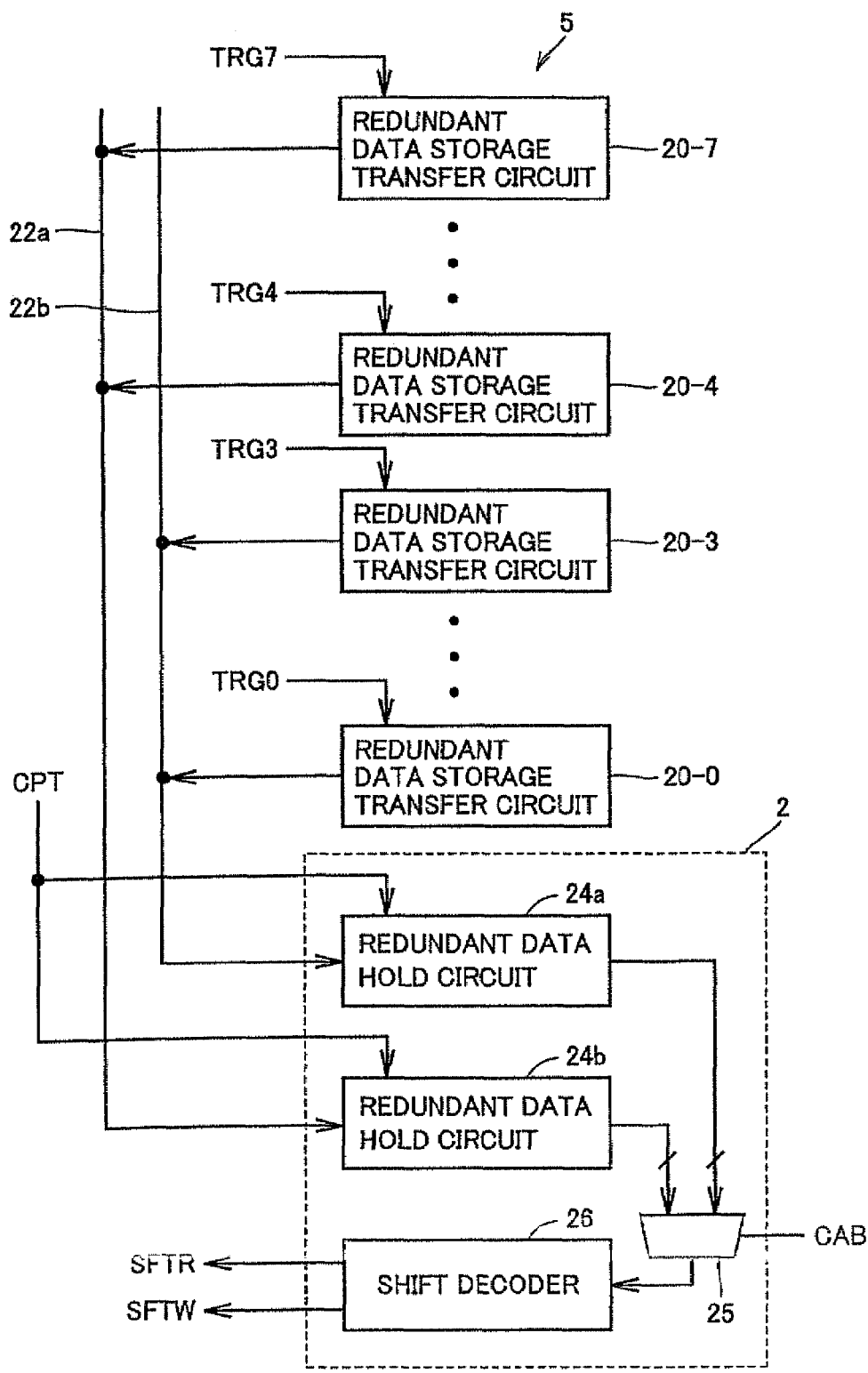
FIG. 3 schematically shows a configuration of a redundant column fuse band and column spare decoder band shown in FIG. 1.

FIG. 3 more specifically shows the configuration of the column fuse band and column spare decoder band shown in FIG. 1. In FIG. 3, there is shown a configuration of a column fuse band 5 and a column spare decoder band 2 arranged in correspondence to one memory array. In column fuse band 5, redundancy data storage transfer circuits 20-0 to 20-7 are arranged in correspondence to the memory cell array blocks.

These redundancy data storage transfer circuits 20-0 to 20-7 are arranged in column fuse blocks 1W0 to 1W7 or 1E0 to 1E7 shown in FIG. 1. Redundancy data storage transfer circuits 20-4 to 20-7 arranged in correspondence to the upper memory cell array blocks transfer the redundancy data programmed by the fuse elements to a redundancy data transfer bus 22a in accordance with trigger signals TRG4 to TRG7, respectively.

Redundancy data storage transfer circuits 20-0 to 20-3 arranged in correspondence to the lower memory cell array blocks transfer the corresponding redundancy data to a redundancy data transfer bus 22b in accordance with trigger signals TRG0 to TRG3, respectively. Since two memory cell array blocks are selected at the same time in memory array MA, storage data of one of redundancy data storage transfer circuits 20-4 to 20-7 are transferred to a redundancy data transfer bus 22a, and storage redundancy data of one of redundancy data storage transfer circuits 20-0 to 20-3 are transferred to a redundancy data transfer bus 22b. The trigger signals TRG0 to TRG7 are generated based on an address signal that designates a memory cell array block.

In spare decoder band 2, there is provided: redundancy data hold circuits 24a and 24b taking in and holding the redundancy data transferred via redundancy data transfer buses 22a and 22b, respectively, in accordance with a capture signal CPT; a selector 25 which selects the redundancy data from one of redundancy data hold circuits 24a and 24b in accordance with a column address signal bit (page selecting address) CAB; and a shift decoder 26 which decodes the data selected by selector 25 and generates shift signals SFTR and SFTW.

It is assumed here that the configuration of redundant replacement is of the shift redundancy scheme as in the conventional device. The redundant replacement is performed in units of I/O line pairs.

Arranging redundancy data storage transfer circuits 20 in correspondence to memory cell array blocks enables the arrangement of fuse program circuits without affecting the interconnection in the memory cell arrays. Where the memory cell arrays is modified in configuration, the redundancy data storage transfer circuits are simply arranged in correspondence to the memory cell array blocks and the number of the redundancy data storage transfer circuits is changed in accordance with the number of the memory cell array blocks. This eliminates the need for the arrangement of unnecessary fuse elements for storing redundancy data, to suppress an increase in occupation area.

Data path bands, in which no column fuses are arranged, are free from the restriction that interconnection must be laid out while avoiding the fuse elements, thereby facilitating the interconnection layout of the data paths.

Figure 4:
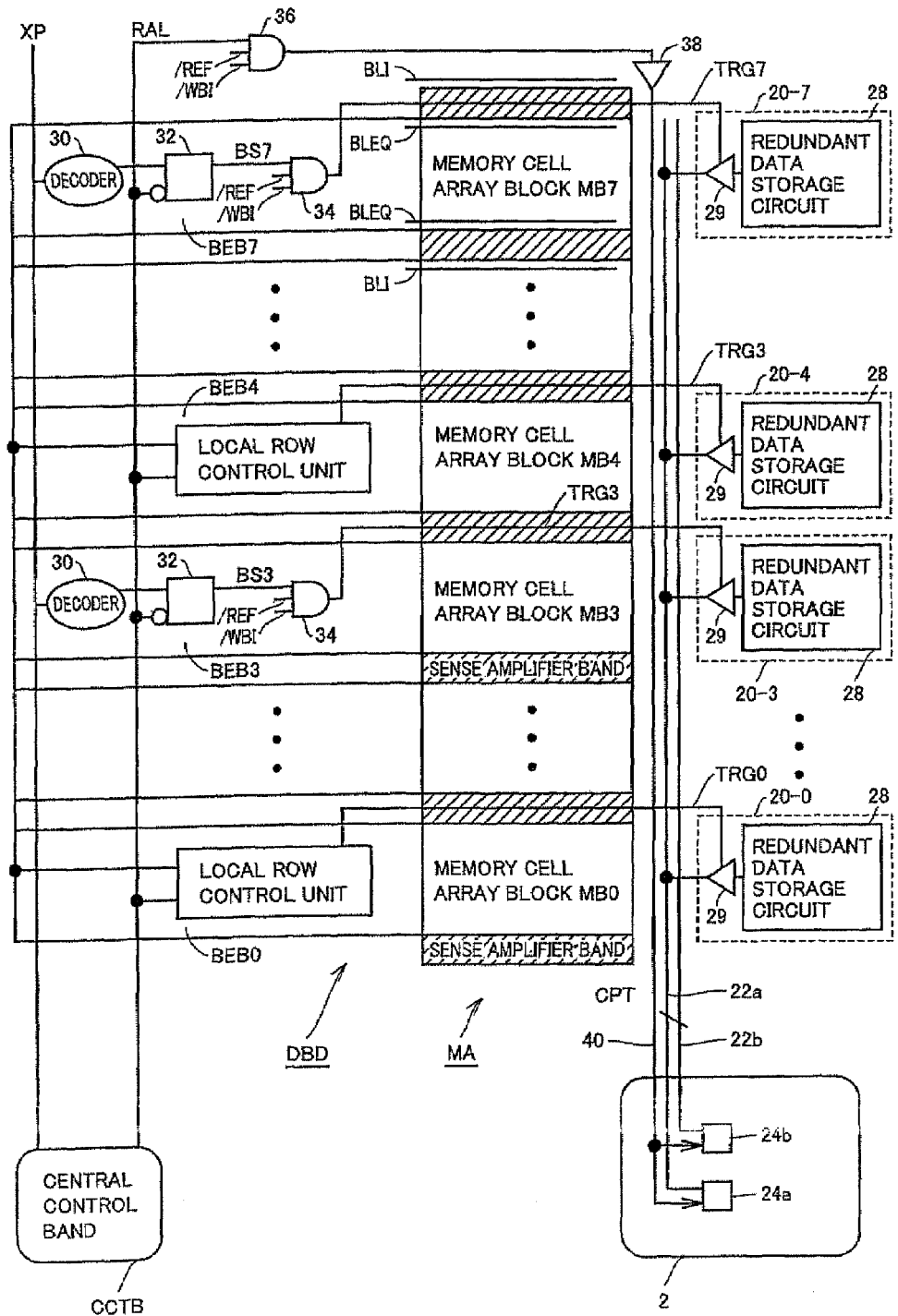
FIG. 4 shows the configuration of a semiconductor memory device according to the first embodiment of the present invention.

FIG. 4 schematically shows a configuration of a part for controlling the transfer of redundancy data. In FIG. 4, local row control units are provided in decoder blocks DEB0 to DEB7 arranged in decoder band DBD in correspondence to memory cell array blocks MB0 to MB7, respectively. The local row control units control the activation/inactivation of the corresponding memory cell array blocks in accordance with the main control circuit and the address predecode signal transferred from the address predecoder arranged in central control band CCTB. FIG. 4 shows, as a representative, the configuration of the part for generating transfer control signals arranged in the local row control units.

In FIG. 4 the local row control units each include a decoder 30 which decodes an upper row predecode signal XP from a row predecoder arranged in central control band CCTB and generates a block selection signal; a latch circuit 32 which latches the output signal of decoder 30 in accordance with row address latch signal RAL transferred from the main control circuit included in central control band CCTB; and an AND circuit 34 which generates trigger signal TRG in response to block selection signal BS (BS0 to BS7) received from latch circuit 32, a refresh instruction signal /REF and a burn-in instruction signal /WBI. Trigger signals TRG0 to TRG7 are transferred crossing the corresponding sense amplifier bands, to be applied to the redundancy data storage transfer circuits arranged outside memory array MA.

Refresh instruction signal /REF is set to L level, that is, the active state when storage data are refreshed. Refresh instruction signal /REF is activated in performing refresh in accordance with an external auto refresh command and in performing a refresh internally, automatically in the self refresh mode.

Burn-in instruction signal /WBI is activated in the burn-in mode where potential defect is made revealed by accelerating a voltage and the temperature, and is activated in the burn-in at the wafer level and in the burn-in after packaging.

Each of redundancy data storage transfer circuits 20-0 to 20-7 includes: a redundancy data storage circuit 28 which includes a fuse set for storing column redundancy data; and a transfer circuit 29 which transfers redundancy data held by redundancy data storage circuit 28 to redundancy data transfer bus 22a or 22b in accordance with the corresponding trigger signal TRG. Transfer circuits 29 are each composed of a 7-bit tri-state buffer.

Transfer circuits 29 of redundancy data storage transfer circuits 20-4 to 20-7 drive redundancy data transfer bus 22a, whereas transfer circuits 29 of redundancy data storage transfer circuits 20-0 to 20-3 drive redundancy data transfer bus 22b when selected.

Redundancy data transfer buses 22a and 22b are coupled to redundancy data hold circuits 24a and 24b, respectively, disposed in column spare decoder band 2. Redundancy data hold circuits 24a and 24b are each composed of a 7-bit flip-flop circuit, and take in and latches the 7-bit redundancy data transferred on redundancy data transfer buses 22a and 22b in accordance with capture signal CPT.

In order to generate capture signal CPT, an AND circuit 36 which receives row address latch signal RAL, refresh instruction signal /REF, and wafer burn-in signal /WBI from central control band CCTB and a drive circuit 38 which drives a capture signal line 40 in accordance with the output signal of AND circuit 36 are provided in the remotest end from the central control band in decoder band DBD.

Capture signal line 40 is laid in parallel with redundancy data transfer buses 22a and 22b, and the output signal of AND circuit 36 is transferred in the row direction. Therefore, the same amount of time is required to transfer capture signal CPT and the redundancy data, which can secure the timing margin for the setup/hold in capturing redundancy data in redundancy data hold circuits 24a and 24b. Operations of redundancy data transfer will be described in the following, while taking as an example the case where memory cell array blocks MB3 and MB7 are selected.

Central control band CCTB is supplied with an ACT command to instruct row selection and a row address signal to designate a selected row. The row address signal is predecoded by the row predecoder included in central control band CCTB, and then transferred to decoder band DBD. The upper row predecode signals XP of the row predecode signals are decoded by a decoder 30 included in each of decoder block DEB0 to DEB7, so as to generate a block designating signal.

When the ACT command is applied, central control band CCTB also activates row address latch signal RAL at a predetermined timing. The output signal of the decoder 30 is latched by latch circuit 32 and row block selection signal is generated in each of decoder blocks DEB0 to DEB7.

In a normal mode of operation, refresh instruction signal /REF and burn-in instruction signal /WBI are both at H level. When row block selection signals BS3 and BS7 are activated, the output signals of corresponding AND circuits 34 attains H level and trigger signals TRG3 and TRG7 are activated. Responsively, transfer circuits 29 in redundancy data storage transfer circuits 20-7 and 20-3 are activated to transfer the column redundancy data with respect to memory cell array blocks MB7 and MB3 to redundancy data hold circuits 24a and 24b included in column spare decoder band 2 via redundancy data transfer buses 22a and 22b, respectively.

On the other hand, the output signal of AND circuit 36 attains H level in response to activation of latch signal RAL, and accordingly, the output signal of drive circuit 38 attains H level. Redundancy data hold circuits 24a and 24b takes in and latch the redundancy data transferred from redundancy data storage transfer circuits 20-3 and 20-7, respectively, in accordance with capture signal CPT on capture signal line 40.

In selecting a row, word line selection is performed in accordance with the lower row predecode signals transferred from central control band CCTB. At this time, according to the main control signal from central control band CCTB, in the local row control unit corresponding to the selected memory cell array block, a bit line equalize instruction signal BLEQ is driven to an inactive state to complete equalizing and precharging the bit lines. A bit line isolation instruction signal BLI for the memory cell array block which shares the sense amplifier band with the selected memory block attains L level, and the non-selected memory cell array block is disconnected from the sense amplifier band.

Then, the word line corresponding to the addressed row is driven to a selected state in accordance with the word line enable signal (not shown), and the memory cell data are read on the bit lines (not shown). Then, the sense amplifier activation signal to be transmitted to the sense amplifier bands arranged for memory cell array blocks MB7 and M3 is activated at a predetermined timing, and the memory cell data of selected memory cell array blocks MB7 and MB3 are sensed and latched.

In refresh operation and burn-in operation, the number of selected word lines is made greater than in the normal data access operation. Therefore, if redundancy data are transferred in these operation modes, transferred data would collide with each other, to cause the data held in the hold circuits to be uncertain, and it would become impossible to hold correct redundancy data in the subsequent operations. Refresh operation and burn-in operation do not require data access, and there is no need to repair a defective column through redundant replacement. Therefore, in the refresh operation and burn-in operation, the output signals of AND circuits 34 and 36 are fixed to L level, to disable the read, transfer and write of redundancy data.

Figure 5:
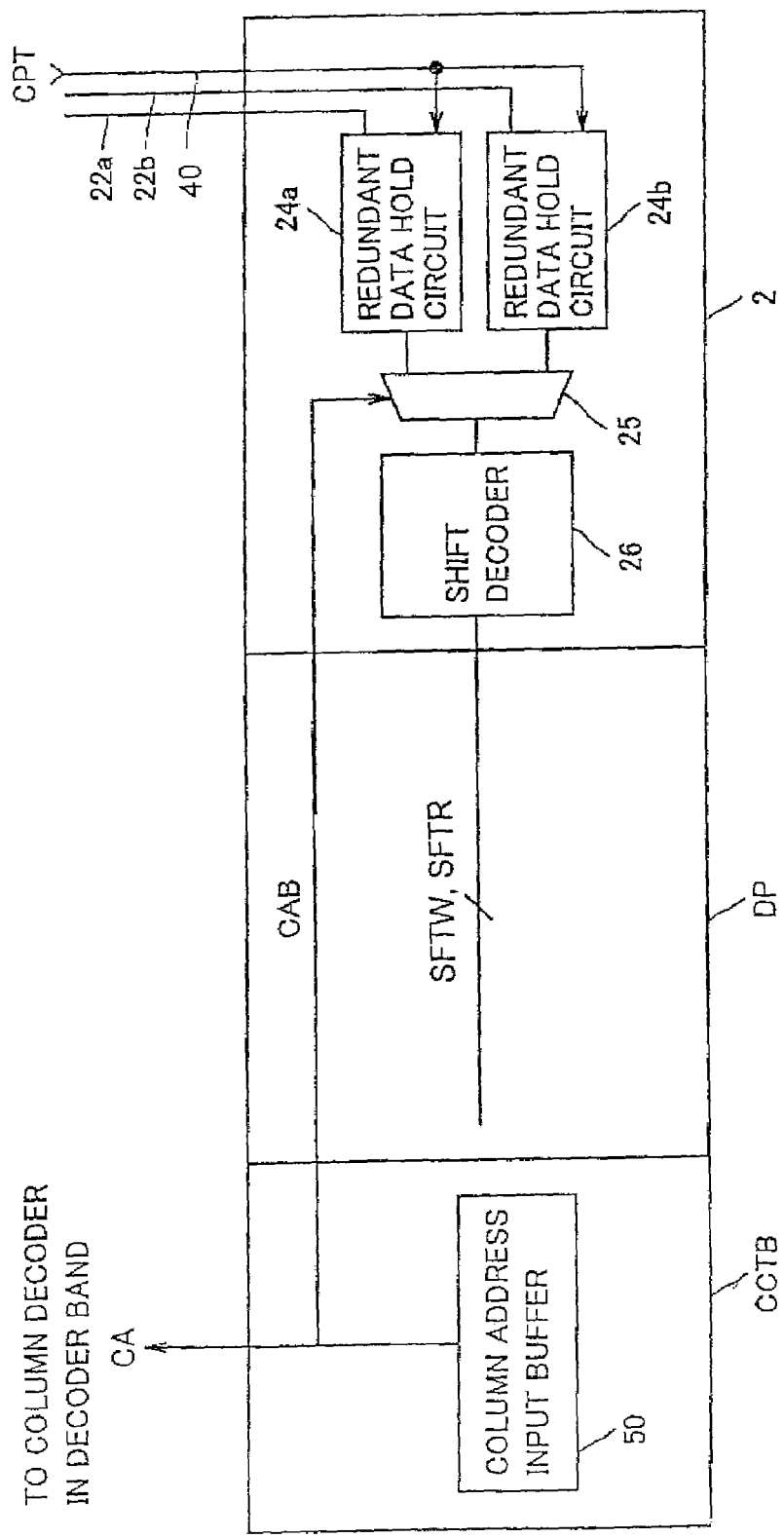
FIG. 5 schematically shows a configuration of a main part of a column redundancy data band, data path and central control band of a semiconductor memory device according to the first embodiment of the present invention.

FIG. 5 schematically shows the configuration of the page selection address generation unit. One memory cell array block of the two memory cell array blocks selected at the same time is designated by page selection address bit CAB. Page selection address bit CAB is transferred to column spare decoder band 2 via data path DP from column address input buffer 50 arranged in central control band CCTB. Column address signal CA from column address input buffer 50 is applied to the column decoders arranged in the decoder band. In decoder blocks arranged in correspondence to the memory cell array blocks, when the corresponding row decoder is activated, the column decoder is enabled and is activated in accordance with a column address decode enable signal, to decode the applied column address signal CA.

Page selection address bit CAB is applied to selector 25 included in each spare decoder band 2. Selector 25 selects redundancy data stored in one of redundancy data hold circuits 24a and 24b in accordance with page selection address bit CAB, and supplies the selected data to shift decoder 26. Shift decoder 26 decodes the redundancy data received from selection circuit 25 and generates a shift signal SFT. In a shift switch circuit, not shown, the connection between data bus lines and a pair of I/O lines is shifted in accordance with shift signal SFT according to shift redundancy scheme.

Various configurations are available for switching the connection paths of I/O line pairs according to shift redundancy scheme. As far as a pair of I/O lines to be replaced is isolated from the internal data line pair and the pair of spare I/O lines and the remaining I/O line pairs are sequentially connected to the internal data line pairs, any configuration can be used for the shift switch circuit and shift decoder.

Figure 6:
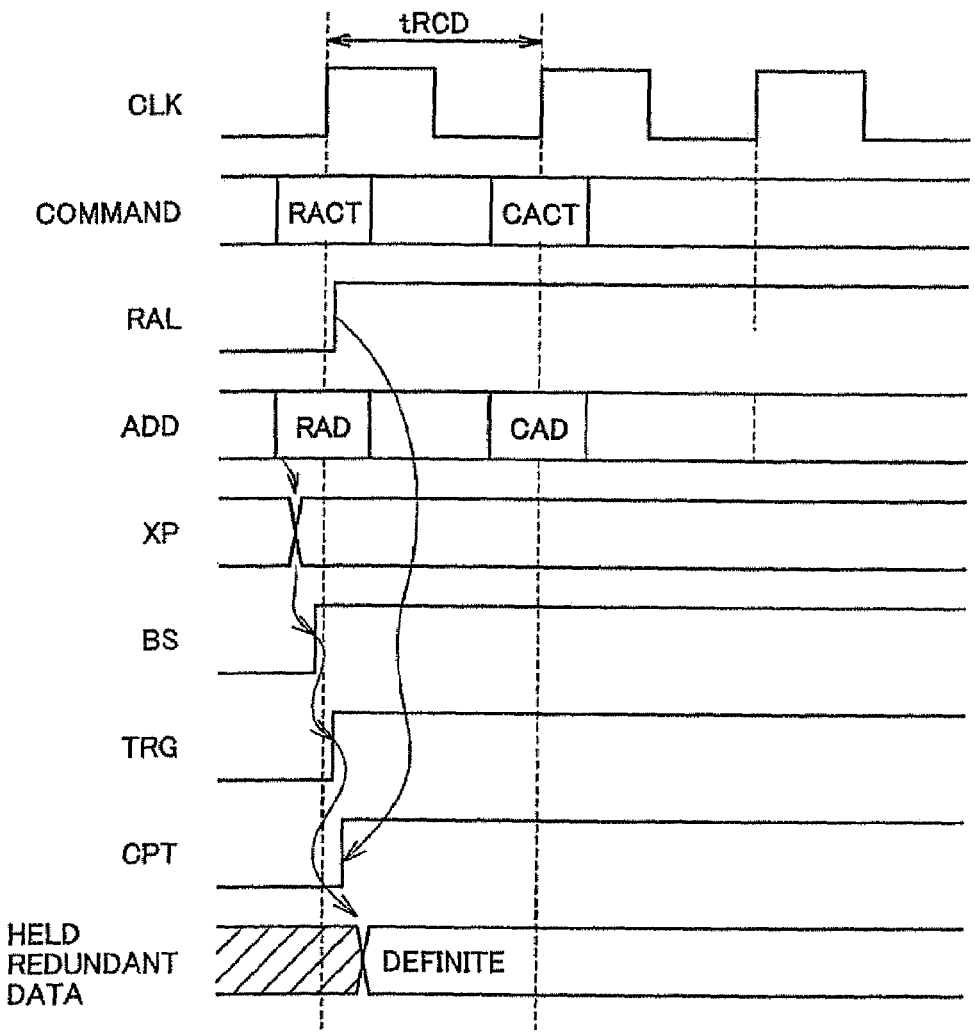
FIG. 6 is a timing chart representing a redundancy data transfer operation of circuitry shown in FIGS. 4 and 5.

FIG. 6 is a timing chart representing the operation to transfer redundancy data. The description will be given of the operation of transferring redundancy data with reference to FIG. 6.

In FIG. 6, a row act command RACT which instructs row selection is applied in synchronization with the rise of a clock signal CLK. A row address signal RAD is applied in parallel with row act command RACT. In central control band CCTB, the block address included in row address signal RAD is predecoded to generate block predecode signals XP. The row address signal RAD includes an address specifying a word line.

In accordance with block predecode signals XP which designate a memory cell array block, block selection signal BS for the selected memory cell array block is driven to a selected state by decoder 30 shown in FIG. 4. When block selection signal BS is driven to a selected state, the output signal of an AND circuit 34 shown in FIG. 4 attains H level, and transfer trigger signal TRG is generated (activated) in accordance with block selection signal BS, and redundancy data are transferred from the redundancy data storage transfer circuit provided for the selected memory cell array block.

On the other hand, in synchronization with the rise of clock signal CLK, row act command RACT is decoded in the main control circuit included in central control band CCTB, it is determined that a row access is instructed, and address latch signal RAL is generated. In accordance with address latch signal RAL, capture signal CPT transferred from AND circuit 36 shown in FIG. 4 via drive circuit 38 is driven to an active state.

In the redundancy data hold circuit arranged in the spare decoder band, the redundancy data transferred in accordance with transfer trigger signal TRG are taken in and latched in accordance with capture signal CPT.

Capture signal line 40 is driven by drive circuit 38, and capture signal CPT is transferred at relatively high speed. On the other hand, each of redundancy data transfer buses 22a and 22b is connected with four transfer circuits (tri-state buffers), and the load of the redundancy data transfer signal lines is larger than that of capture signal line 40.

Figure 7:
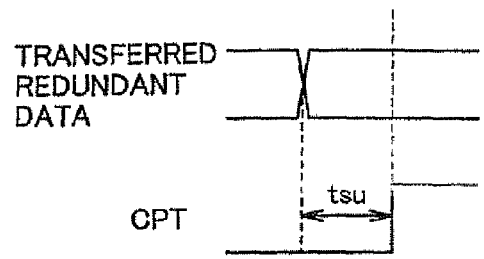
FIG. 7 shows setup/hold requirements of redundancy data of the redundancy data hold circuits shown in FIGS. 4 and 5.

However, capture signal CPT is generated in accordance with row address latch signal RAL that is generated by decoding the command. Trigger signal TRG is generated in accordance with block selection signal BS. After the start of the redundancy data transfer operation, capture signal CPT is activated. Consequently, as shown in FIG. 7, in the redundancy data hold circuit, capture signal CPT attains H level after arrival of redundancy data. Hence, a sufficient setup time tsu can be secured for redundancy data.

Therefore, after a so-called RAS-CAS delay time tRCD passes, even if a column act command CACT instructing column selection is applied together with a column address signal CAD, a shift signal can be generated correctly because redundancy data is already transferred to and latched by the redundancy data hold circuits.

The redundancy data and capture signal CPT are transferred in the same direction. In addition, the output signals of AND circuits 34 and 36 are transferred in the same direction and have substantially the same transfer distance. In this case, the time difference between capture signal CPT and the transferred redundancy data becomes smallest when redundancy data are transferred from redundancy data storage circuit 20-7 to redundancy data hold circuits 24a and 24b. However, in this case, too, the time difference between activation of address latch signal RAL and activation of block selection signal BS can be secured by a required minimum amount for the redundancy data from redundancy data storage transfer circuit 20-7. Thus, the setup time of the redundancy data for the farthest memory cell array block can be secured.

As described above, according to the first embodiment of the present invention, the fuse program circuits which store column redundancy data are arranged in correspondence to the memory cell array blocks, and the column redundancy data corresponding to the selected memory cell array blocks are transferred to and held in the column spare decoder band in a time period from the start of row selection operation before the start of column selection operation. Consequently, even when the configuration of the memory cell arrays is modified, the number of the column redundancy data storage circuits is automatically varied according to a change in the number of the memory cell array blocks. Unnecessary fuse program circuits need not to be arranged, thereby suppressing an area increase.

The fuse program circuits including fuse elements are disposed outside the memory cell arrays, which enables the arrangement of a number of fuse elements in the redundancy data storage transfer circuits, without considering interconnection layout. Since fuse elements inhibiting arrangement of interconnection lines are not provided in the circuit region such as a data path, the interconnection layout can be facilitated.

When the semiconductor memory device has a bank configuration, such a configuration needs only to be employed for each bank, in which the redundancy data hold circuits shown in FIG. 4 are arranged in the spare decoder band and the redundancy data held in the redundancy data hold circuits are selected and applied to the shift decoder in accordance with the page selection address and the band address. Arranging redundancy data hold circuits physically corresponding to each bank can change the number of the redundancy data hold circuits according to a change in the number of banks. In this case, merely combining the bank address with the capture signal enables redundancy data to be captured and transferred to the shift decoder, using the common bus interconnection lines.

In the case of bank configuration, the redundancy data hold circuits and the selectors may be previously arranged according to the maximum number of banks. It becomes possible to sufficiently suppress an increase in the area of the column spare decoder band, as compared with the case where the fuse elements are arranged for the maximum number of memory array blocks.

Second Embodiment

Figure 8:
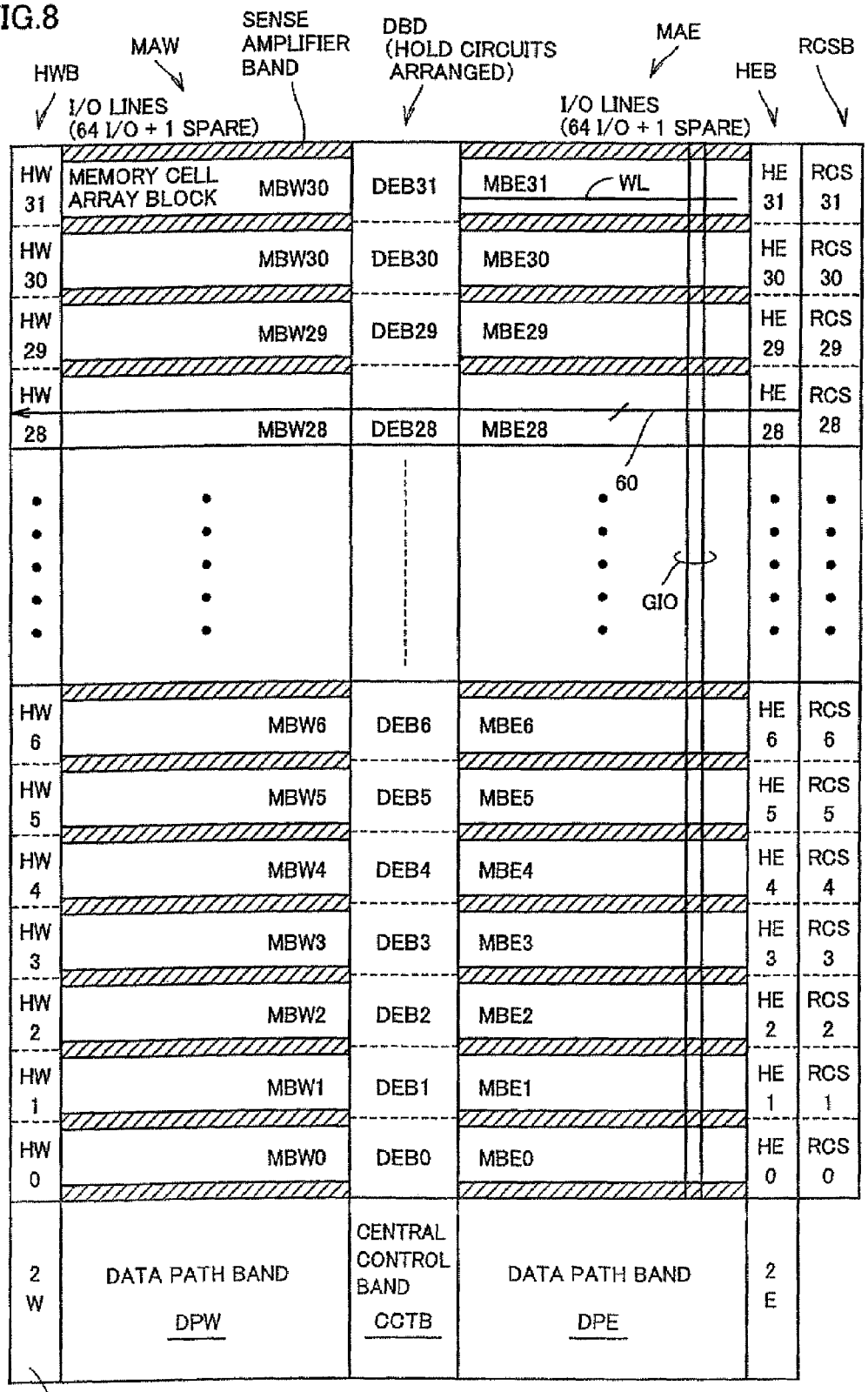
FIG. 8 schematically shows a configuration of a semiconductor memory device according to a second embodiment of the present invention.

FIG. 8 schematically shows an entire configuration of a semiconductor memory device according to a second embodiment of the present invention. In FIG. 8 a memory array MAW is divided into 32 memory cell array blocks MEW0 to MBW31 by sense amplifier bands, and a memory cell array MAE is divided into 32 memory cell array blocks MBE0 to MBE31 by the sense amplifier bands. In selecting a row, two memory cell array blocks are selected at the same time in memory cell array MAW, and also two memory cell array blocks are selected at the same time in memory cell array MAE. In this case, one memory cell array block is selected at the same position in each of the 16 upper memory cell array blocks and 16 lower memory cell array blocks. For example, memory cell array blocks MBE0 and MBE16 are selected at the same time or memory cell array blocks MBE1 and MBE17 are selected at the same time.

Outside memory arrays MAW and MAE, column redundancy data hold circuit bands HWB and HEB for holding column redundancy data are arranged. Column redundancy data hold circuit band HWS is divided into column redundancy data hold blocks HW0 to HW31 in correspondence to memory cell array blocks MBW0 to MBW31. Column redundancy data hold circuit band HEB is divided into column redundancy data hold blocks HE0 to HE31 in accordance with memory cell array blocks MBE0 to MBE31. These column redundancy data hold blocks HW0 to HW31 and HE0 to HE31 hold the column redundancy data of the corresponding memory cell array blocks.

A decoder band DBD is provided between memory cell arrays MAW and MAE. Decoder band DBD is divided into decoder blocks DEB0 to DEB31 in accordance with memory cell array blocks. Each of decoder blocks DEB0 to DEB31 includes a row decoder and a column decoder, and further a row redundancy data hold circuit. Different from the configuration shown in FIG. 1, decoder band DBD has no row fuse circuits for storing row redundancy data.

Outside column redundancy data hold circuit band HEB, a row/column redundancy data storage circuit band RCSB is arranged. Row/column redundancy data storage circuit band RCSB is divided into row/column redundancy data storage transfer blocks RCS0 to RCS31 in correspondence to the memory cell array blocks of memory cell arrays MAE and MAW. Memory cell array blocks MBW0 to MBW31 and MBE0 to MBE31 each include 64 word lines WL and one spare word line. In each of memory cell arrays MAW and MAE, 64 pairs of I/O lines and a pair of spare I/O lines are provided.

Therefore, in row/column redundancy data storage transfer blocks RCS0 to RCS31, a total of 7-bit fuse elements for a 6-bit address specifying a word line and 1 bit indicating the presence or absence of a defective word line are used to repair a defective word line. Therefore, in order to repair a defective row in each of memory array MAE and MAW, two 7-bit fuse sets are provided for the corresponding spare word lines. In order to repair a defective column in each of memory array MAE and MAW, two 7-bit fuse sets are provided. The storage data of the row/column redundancy data storage transfer circuits are transferred to the corresponding row and column redundancy data hold circuits via corresponding fuse data transfer buses 60 extending in the row direction.

Figure 9:
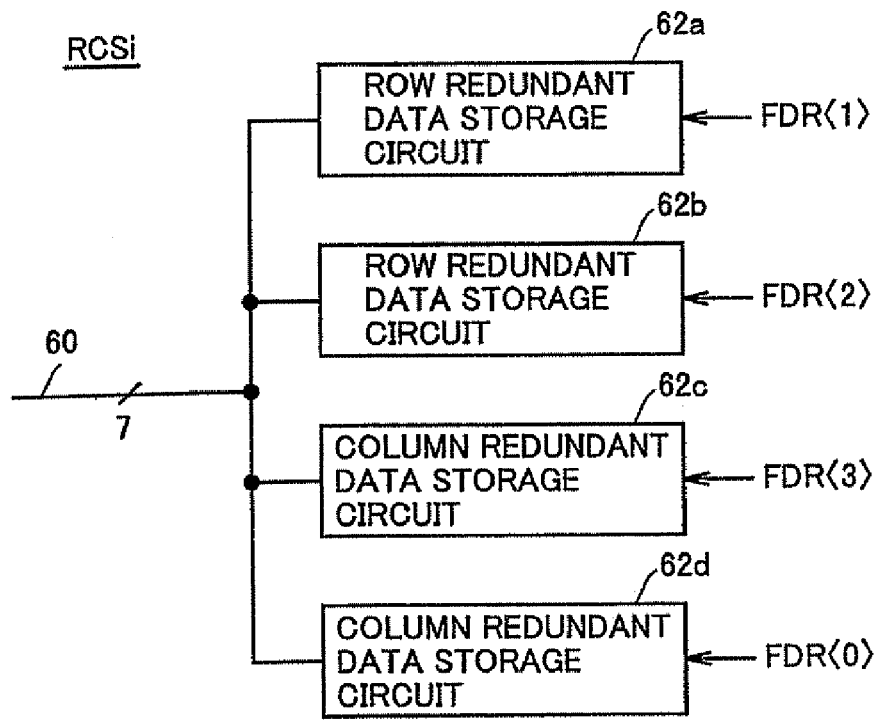
FIG. 9 schematically shows a configuration of a redundant row/column fuse band shown in FIG. 8.

FIG. 9 schematically shows an example of a configuration of a row/column redundancy data storage transfer block RCSi. In FIG. 9, row/column redundancy data storage transfer block RCSi includes row redundancy data storage circuits 62a and 62b which store defective row addresses (redundancy data) of the respective memory cell array blocks, and column redundancy data storage transfer circuits 62c and 62d which store defective column (I/O line pairs) data of the corresponding memory cell array blocks. Each of row redundancy data storage transfer circuits 62a, 62b and column redundancy data storage transfer circuits 62c, 62d includes fuse elements of 7 bits and switching transistors for readout of 7 bits. Redundancy data storage transfer circuits 62a to 62d transfer programmed redundancy data to 7-bit fuse data transfer bus 60 in accordance with fuse data read signals FDR<1> to FDR<3> and FDR<0>, respectively.

The correspondence between fuse data read signals FDR<3> to FDR<0> and the redundancy data is arbitrary, and an appropriate transfer sequence can be used as the transfer sequence of the row redundancy data and the column redundancy data.

Figure 10:
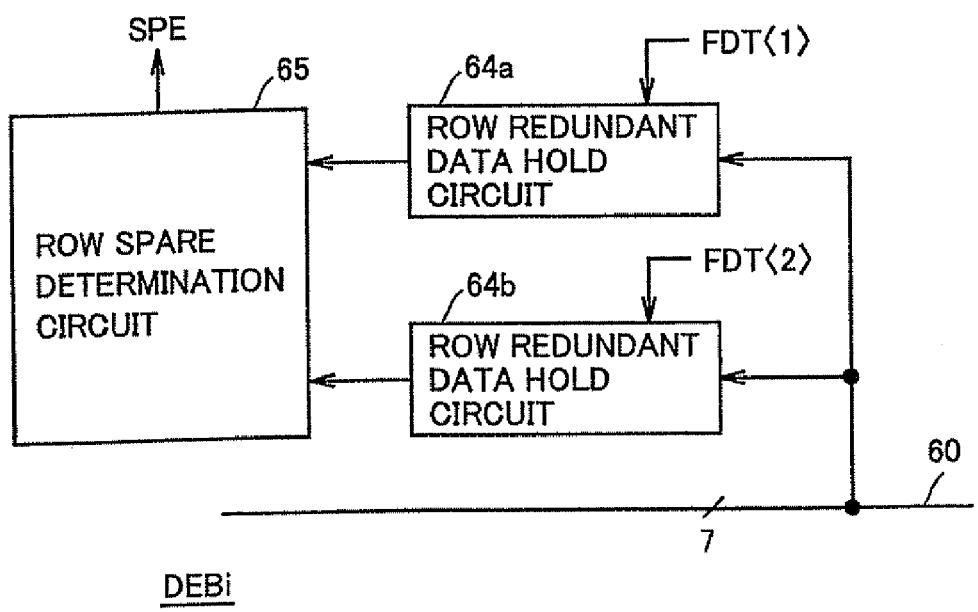
FIG. 10 schematically shows a configuration of a main part of decode blocks in a decoder band shown in FIG. 8.

FIG. 10 schematically shows a configuration of a part related to the redundancy data of one decoder block DEBi. In FIG. 10, data block DEBi includes row redundancy data hold circuits 64a and 64b which take in and hold row redundancy data applied via fuse data transfer bus 60 in accordance with fuse data capture signals FDT<1> and FDT<2>, respectively, and a row spare determination circuit 65 which determines coincidence/non-coincidence between the redundancy data held in row redundancy data hold circuits 64a, 64b and a applied word line address signal, which is not shown, and generates a spare row enable signal SPE according to the determined result.

Row redundancy data hold circuits 64a and 64b hold the row redundancy data of the memory cell array blocks included in memory arrays MAE and MAW, respectively. Row spare determination circuit 65 performs spare determination individually for row redundancy data hold circuits 64a and 64b, and generates spare enable signal SPE for each memory cell array block. When spare enable signal SPE (SPEE, SPEW) is activated, the corresponding normal row decoder is inactivated and the corresponding spare row decoder is activated. As a result, a defective normal word line is replaced by a spare word line so as to repair a defective row.

Row redundancy data hold circuits 64a and 64b are each composed of a 7-bit flip-flop circuit, and take in and hold row redundancy data applied according to fuse data capture signals FDT<1> and FDT<2>.

Figure 11:
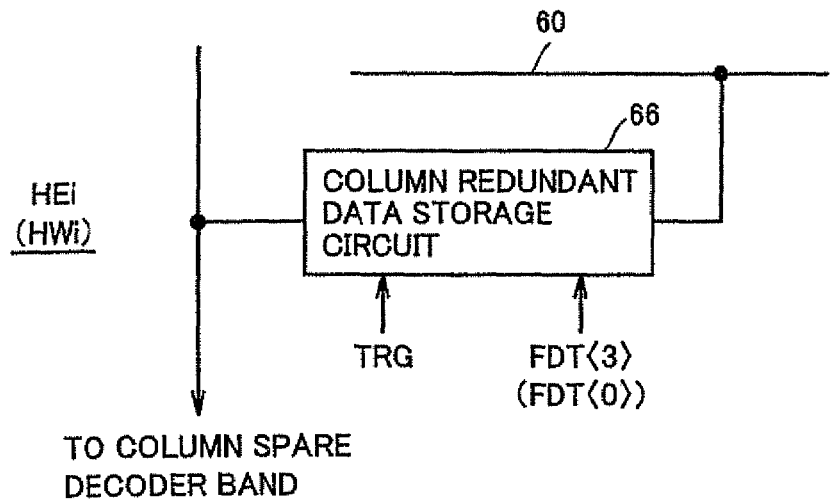
FIG. 11 schematically shows a configuration of a column redundant hold block shown in FIG. 8.

FIG. 11 schematically shows a configuration of a column redundancy data hold blocks HWi and HEi. Since redundancy data hold blocks HWi and HEi have the same configuration and only differ in fuse data capture signal to be supplied, FIG. 11 shows the configuration of column redundancy data hold block HEi only.

In FIG. 11, column redundancy data hold block HEi includes a column redundancy data hold circuit 66 which captures redundancy data applied via fuse data transfer bus 60 in accordance with fuse data capture signal FDT<3> and transfers the holding redundancy data to the column spare decoder band in accordance with trigger signal TRG. Column redundancy data hold circuit 66 includes a 7-bit flip-flop circuit which captures redundancy data applied in accordance with a fuse data capture signal FDT<3>, and a transfer circuit which is composed of a 7-bit tri-state buffer for transferring the data held in the flip-flop circuit to a redundancy data transfer path (24) in response to the activation of trigger signal TRG.

Figure 12:
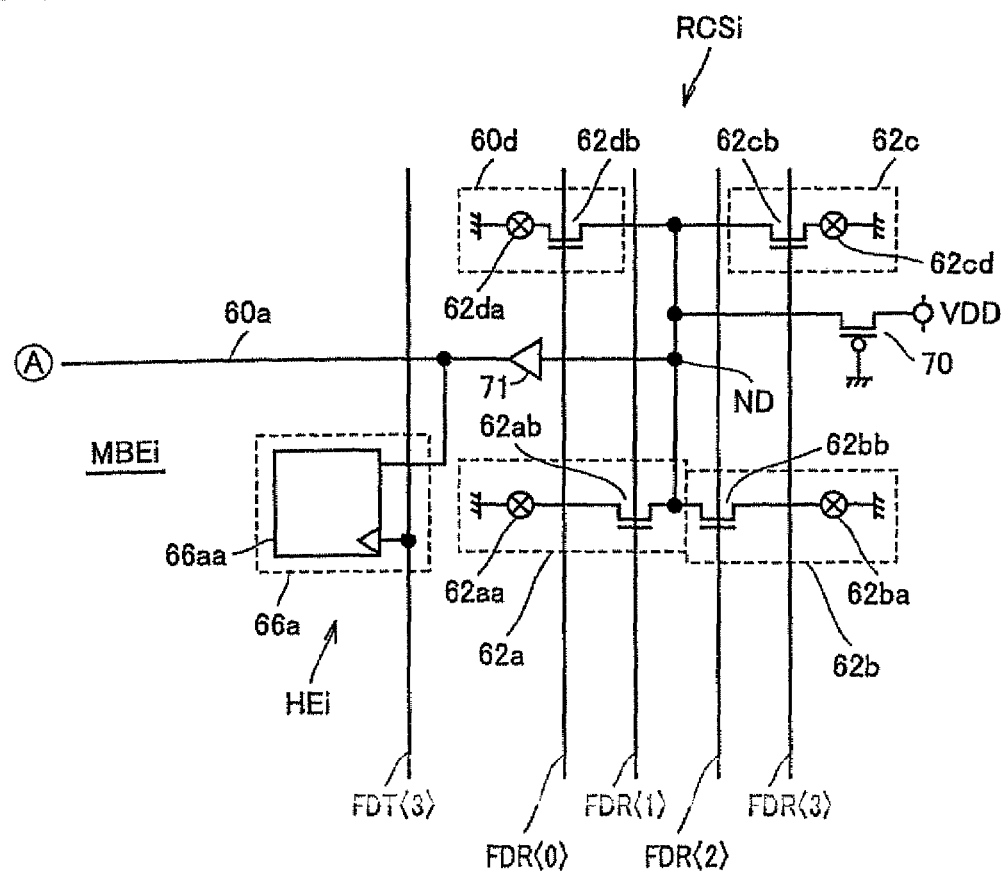
FIG. 12 further specifically shows a configuration of a redundancy data storage circuit shown in FIG. 9.

FIG. 12 shows a specific configuration of row redundancy data storage circuits 62a and 62b, column redundancy data storage circuits 62c and 62d, and column redundancy data hold circuit 66a shown in FIG. 9. FIG. 12 shows a configuration of a part related to 1-bit redundancy data.

In FIG. 12, row redundancy data storage circuit 62a includes a fuse element 62aa and an N-channel MOS transistor 62ab which couples fuse element 62aa to a node ND in accordance with fuse data read signal FDR<1>. Row redundancy data storage circuit 62b includes a fuse element 62ba and an N-channel MOS transistor 62bb which connects fuse element 62ba to node ND in accordance with fuse data read signal FDR<2>.

Column redundancy data storage circuit 62c includes a fuse element 62ca and an N-channel MOS transistor 62cb which connects fuse element 62ca to node ND in accordance with fuse data read signal FDR<3>. Column redundancy data storage circuit 62d includes a fuse element 62da and an N-channel MOS transistor 62db which connects fuse element 62da to node ND in accordance with fuse data read signal FDR<0>.

In order to read storage data of the selected redundancy data storage circuit, a drive circuit 71 is provided for driving a fuse data transfer signal line 60a in accordance with the voltage level of node ND. Node ND is pulled up to the level of a power supply voltage VDD by a P-channel MOS transistor 70 which receives the ground voltage at a gate thereof.

In column spare data hold block HEi, column data hold circuit 66a includes a flip-flop 66aa which latches a signal on fuse data transfer signal line 60a in accordance with fuse data capture signal FDT<3>.

In the configuration of redundancy data storage circuits 62a to 62d shown in FIG. 12, when one of fuse data read signals FDR<3:0> is driven to a selected state, the corresponding MOS transistor is rendered conductive. When the corresponding fuse element is blown, node ND is maintained at the power supply voltage level pulled up by MOS transistor 70. On the other hand, when the corresponding fuse element is not blown, node ND is discharged to the ground voltage level.

Figure 13:
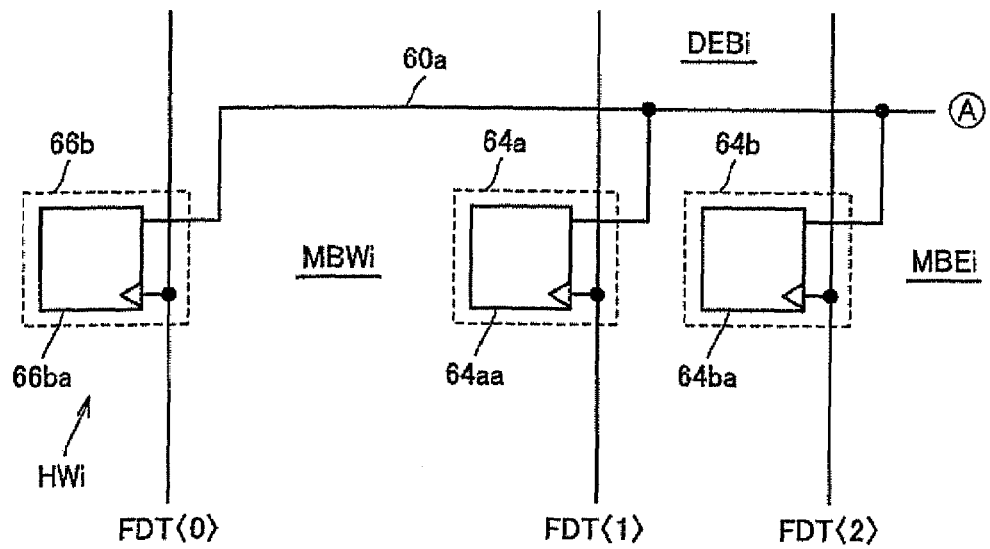
FIG. 13 shows a specific configuration of a redundancy data hold circuit shown in FIGS. 10 and 11.

FIG. 13 shows the configuration of row redundancy data hold circuits 64a and 64b and a column redundancy data hold circuit 66b which is disposed in column redundancy data hold circuit block HWi in the column spare decoder band. FIG. 13 shows, as a representative, the configuration of the part related to 1-bit redundancy data, the reference character A in both FIGS. 12 and 13 indicating that the fuse data transfer signal 60a shown in FIG. 13. In FIG. 13, row redundancy data hold circuit 64a disposed in decoder band DEBi includes a flip-flop 64aa which takes in and holds a signal on fuse data transfer signal line 60a when fuse data capture signal FDT<1> is activated. Row redundancy data hold circuit 64b includes a flip-flop 64ba which takes in and holds a signal on fuse data transfer signal line 60a when fuse data capture signal FDT<2> is activated.

Column redundancy data hold circuit 66b includes a flip-flop 66ba which is disposed in column redundant hold circuit band HWi outside memory cell array block MBWi, and takes in and holds a signal on fuse data transfer signal line 60a in response to fuse data capture signal FDT<0>. Row and column redundancy data are transferred from row/column redundancy data circuit band RSCi shown in FIG. 12 onto fuse data transfer signal line 60a shown in FIG. 13.

Fuse data capture signals FDT<3:0> and fuse data read signals FDR<3:0> are transferred from the central control band. The description will now be given of the operation of holding redundancy data of the redundancy data storage/hold circuits shown in FIGS. 9 to 13.

The row and column redundancy data are programmed by blowing/non-blowing fuse elements 62aa to 62ba shown in FIG. 12. In DRAM (dynamic random access memory), at the start-up after power up (at the time of initialization), dummy cycle is executed to ensure the initializing of the internal states. In a clock synchronous DRAM (SDRAM), it is defined by specification that auto refresh is performed eight times at the power-up or the start-up upon resetting of the system. When the auto refresh is performed eight times for the dummy cycles, concurrently, row and column redundancy data are transferred. Therefore, it is necessary to transfer two row redundancy data and two column redundancy data, and these row and column redundancy data are transferred sequentially during the execution of auto refresh of a total of 4 times.

Figure 14:
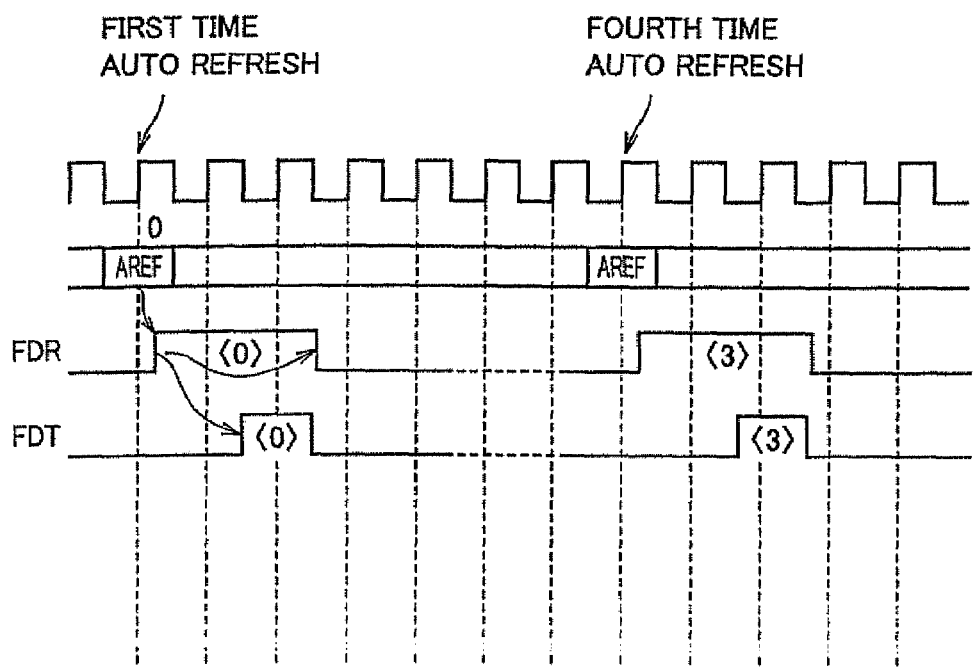
FIG. 14 is a timing chart representing a redundancy data transfer operation of the semiconductor memory device according to the second embodiment of the present invention.

FIG. 14 is a timing chart representing a redundancy data transfer operation in initialization. When an auto refresh command AREF is supplied, the period of time during which the word lines are kept in a selected state internally is automatically determined, and precharge operation is automatically performed after elapse of the predetermined time period. When auto refresh command AREF is applied for the first time, data read signal FDR<0> is driven to an active state according to the row selecting operation. As a result, the column redundancy data stored in column redundancy data storage circuit 62a is transferred to fuse data transfer bus 60.

When a predetermined time period elapses, fuse data capture signal FDT<0> is activated and column redundancy data hold circuit 66b stores the transferred column redundancy data.

Subsequently, when auto refresh command is applied a second time and a third time, fuse data read signals FDR<1> and FDR<2> are activated, respectively, and then fuse data capture signals FDT<1> and FDT<2> are activated at predetermined timings. Consequently, the row redundancy data stored in row redundancy data storage circuits 62a and 62b are stored in row redundancy data hold circuits 64a and 64b, respectively.

After auto refresh command AREF is applied a fourth time, fuse data read signal FDR<3> is activated, and the storage data program data) of column redundancy data storage circuit 62c is transferred onto fuse data transfer bus 60. After the predetermined time period elapses, fuse data capture signal FDT<3> is activated, and the column redundancy data are captured and stored in column redundancy data hold circuit 66a.

Consequently, when the auto refresh in the initializing sequence is executed, fuse data read signal FDR and fuse data capture signal FDT are activated/inactivated in accordance with the row-related control signals generated internally, enabling transference of redundancy data. Fuse data read signals FDR<3:0> and fuse data capture signals FDT<3:0> are sequentially generated by counting auto refresh command using a count circuit.

Figure 15:
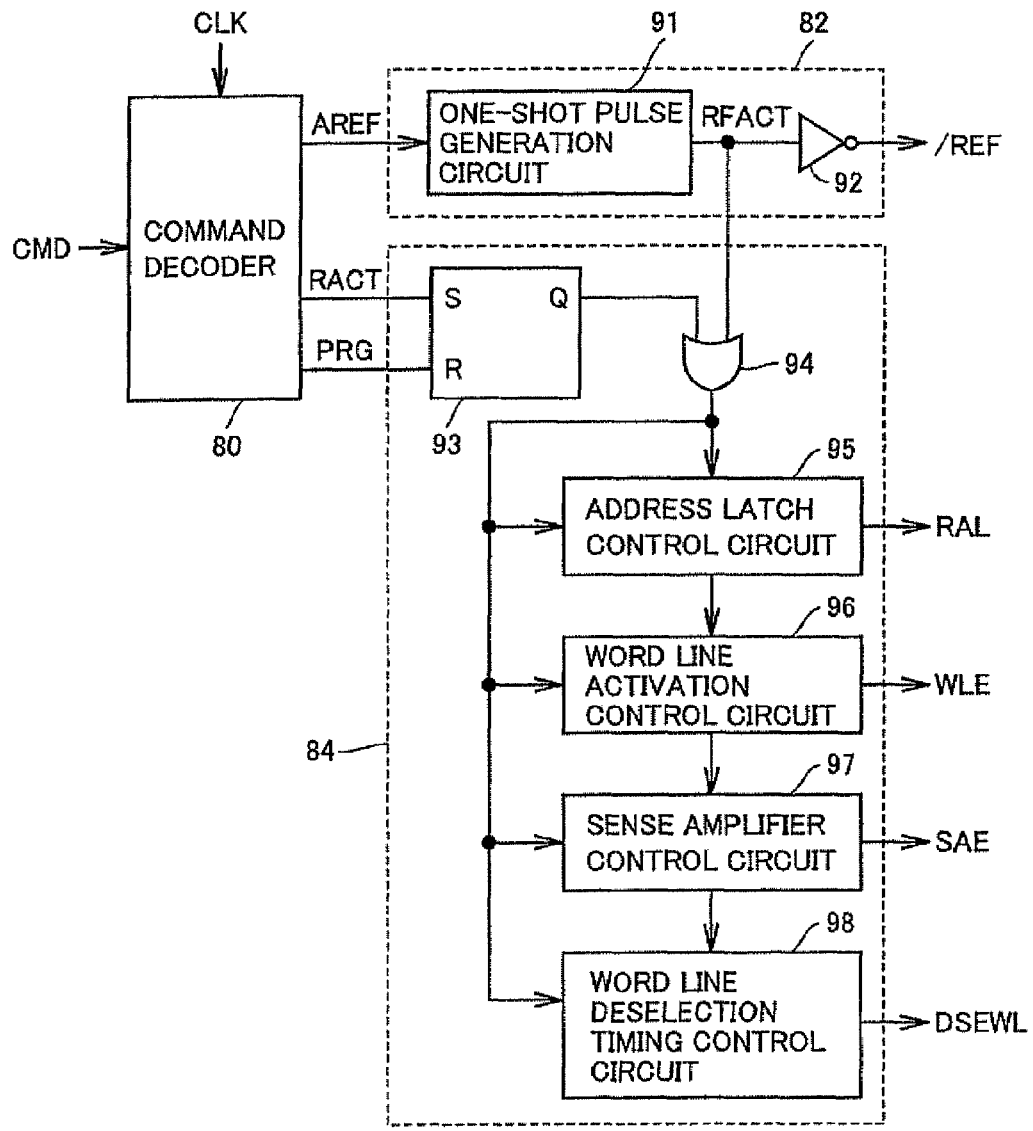
FIG. 15 schematically shows a configuration of a row-related control signal generation unit of a central control band according to the second embodiment of the present invention.

FIG. 15 schematically shows a configuration of a main control signal generation unit included in the central control band. In FIG. 15 the main control signal generation unit includes a command decoder 80 which takes in and decodes a command CMD externally applied in synchronization with clock signal CLK; a refresh control circuit 82 which controls the operations necessary for auto refresh in accordance with auto refresh instruction signal AREF from the command decoder 80; and a main row-related control circuit 84 which generates main row-related control signals necessary for word line selection in accordance with row act instruction signal RACT from command decoder 80, a precharge instruction signal PRD, and a refresh activation signal RFACT from refresh control circuit 82.

Refresh control circuit 82 includes a one-shot pulse generation circuit 91 which generates a one-shot pulse signal having a predetermined time width when auto refresh instruction signal AREF from command decoder 80 is activated; and an inverter circuit 92 which generates refresh instruction signal /REF by inverting output signal RFACT of one-shot pulse generation circuit 91. One-shot pulse generation circuit 91 generates a one shot pulse signal RFACT in response to a refresh request when self refresh mode is designated. By generating refresh activation signal RFACT in a one shot pulse form, word line selection and de-selection are automatically executed internally in auto refreshing and self refreshing.

The refresh control circuit includes a refresh address generation circuit for generating refresh addresses, and a timer circuit for setting a refresh timing in the self refresh mode, but these components are not shown.

Refresh instruction signal /REF is generated in the local row control units in the decoder band DBD shown in FIG. 4 and the transfer of redundancy data is disabled during the refresh operation. During the activation of refresh instruction signal /REF, the operations of column-related circuits are disabled. The time period of selecting word lines in refresh operation is determined by the time period of activation of refresh activation signal RFACT.

Refresh instruction signal /REF could be generated, in place of inverter 92, from an NOR circuit that receives refresh activation signal RFACT and a self refresh mode instruction signal SRF so that refresh instruction signal /REF becomes active (L level) when one of the refresh activation signal RFACT and self refresh mode instruction signal SRF is activated.

Main row-related control signal generation circuit 84 includes a set/reset flip-flop 93 which is set in response to the activation of row act instruction signal RACT from command decoder 80 and is reset in response to the activation of precharge instruction signal PRG; an OR circuit 94 which receives the output signal of set/reset flip-flop 93 and refresh activation signal RFACT; an address latch control circuit 95 which drives row address latch signal RAL to H level in response to activation of an output signal of OR circuit 94; a word line activation control circuit 96 which drives word line enable signal WLE into an active state at a predetermined timing in response to the activation of row address latch signal RAL; a sense amplifier control circuit 97 which activates sense amplifier enable signal SAE after a predetermined period of time passes in response to activation of word line enable signal WLE; and a word line deselection timing control circuit 98 which generates a word line disable signal DSEWL when a predetermined time period passes after the activation of sense amplifier activation signal SAE.

Control circuits 95 to 98 drive the corresponding row-related control signals into an inactive state in a predetermined sequence when the output signal of OR circuit 94 attains L level. Word line disable signal DSEWL from word line deselection timing control circuit 98 inactivates the pulse signal outputted from one-shot pulse generation circuit 91 when activated, and determines the internal refresh time period in the refresh operation.

Figure 16:
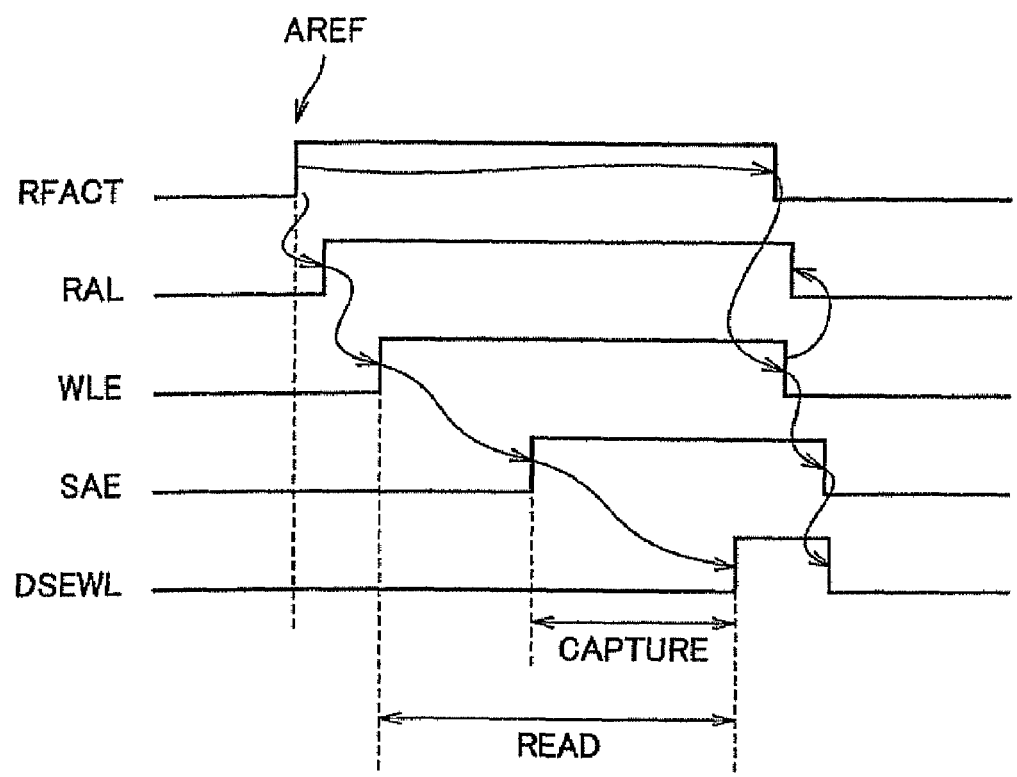
FIG. 16 is a timing chart representing an operation of circuitry shown in FIG. 15.

FIG. 16 shows signal waveforms representing a refreshing operation of the main row-related control circuit shown in FIG. 15. The description will now be given of the operation of the circuit shown in FIG. 15 with reference to FIG. 16.

When auto refresh command is applied and auto refresh instruction signal AREF attains the H level, refresh activation signal RFACT from one-shot pulse generation circuit 91 shown in FIG. 15 is activated and kept at the H level during the predetermined time period. When refresh activation signal RFACT is activated, row address latch signal RAL from address latch control circuit 95 attains the H level. Even when row address latch signal RAL is activated, refresh instruction signal /REF is at L level, so the contents held in the hold circuits are not transferred.

When row address latch signal RAL rises to the H level and word line address (refresh address) for the selected memory cell array block is made definite, word line enable signal WLE from word line activation control circuit 96 is driven to the H level. Accordingly, the word line designated by the refresh address is driven to a selected state.

Next, when word line enable signal WLE is driven to the H level, after the predetermined period of time, sense amplifier activation signal SAE from sense amplifier control circuit 97 is activated, and memory cell data are sensed, amplified and restored to perform refreshing of data.

When sense amplifier enable signal SAE is activated and the predetermined time period passes, word line disable signal DSEWL from word line deselection timing control circuit 98 is activated. Responsively, refresh activation signal RFACT is inactivated.

When refresh activation signal RFACT is inactivated, the output signal of OR circuit 94 attains the L level. Accordingly, word line activation control circuit 96 inactivates word line enable signal WLE first, and then inactivates row address latch signal RAL, and address latching is completed.

Then, sense amplifier enable signal SAE from sense amplifier control circuit 97 is inactivated, and accordingly, word line disable signal DSEWL from word line deselection timing control circuit 98 is inactivated.

In response to the activation of word line enable signal WLE, redundancy data stored in the redundancy data storage circuits are transferred, and the transferred redundancy data are captured and stored in response to the activation of sense amplifier enable signal SAE Completion of the read and capture of these redundancy data is set by word line disable signal DSEWL.

Figure 17:
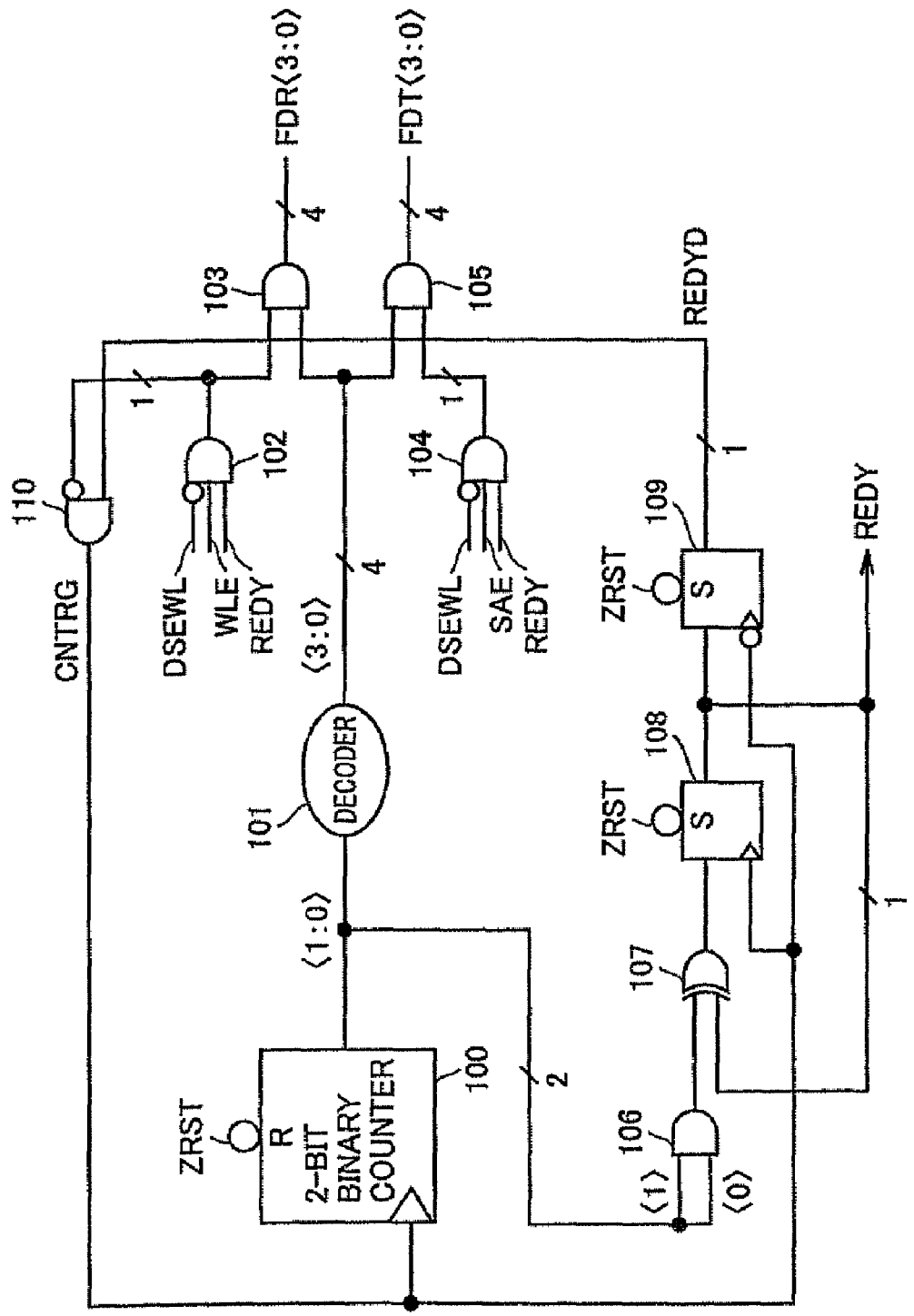
FIG. 17 schematically shows a configuration of a part for generating a fuse data read and capture signal according to the second embodiment of the present invention.

FIG. 17 schematically shows a configuration of a fuse data read and capture signal generation unit. The fuse data read/capture signal generation unit is disposed in central control band CCTB.

In FIG. 17, fuse data read/capture signal generation unit includes a 2-bit binary counter 100 which performs counting operation in synchronization with the rise of a count trigger signal CNTRG; a decoder 101 which generates 4-bit signals <3:0> by decoding the output bits <1:0> of 2-bit binary counter 100; a gate circuit 102 which receives word line disable signal DSEWL, word line enable signal WLE, and a ready signal REDY; an AND circuit 103 which receives the output signal of gate circuit 102 and the output signal of decoder 101, and generates 4-bit fuse data read signals FDR<3:0>; a gate circuit 104 which receives word line disable signal DSEWL, sense amplifier enable signal SAE, and ready signal REDY; and a 4-bit AND circuit 105 which receives the output signal of gate circuit 104 and the output signals <3:0> of decoder 101, and generates 4-bit fuse data capture signals FDT<3:0>.

The gate circuit 102 outputs an H level signal when word line disable signal DSEWL is at L level and word line enable signal WLE and ready signal REDY are at H level. Gate circuit 104 output a H level signal when word line disable signal DSEWL is at L level and sense amplifier enable signal SAE and ready signal REDY are both at H level. Ready signal REDY is initialized to the H level and is set to the L level after the completion of the transfer of redundancy data.

AND circuit 103 includes AND gates provided in correspondence to the output bits <3:0> of decoder 101, and performs AND operation on the output signal of gate circuit 102 and each respective bit of output bits <3:0> of decoder 101, to generate 4-bit fuse data read signals FDR<3:0>.

Similarly, AND circuit 105 includes AND gates provided in correspondence to the 4 output bits <3:0> of decoder 101, and generates 4-bit fuse data capture signals FDT<3:0> by performing AND operation on the 1-bit output signal of gate circuit 104 and each respective bit of the 4 bits <3:0> outputted from decoder 101.

Fuse data read/capture signal generation unit includes an AND gate 106 which receives 2 bits <1:0> of 2-bit binary counter 100; an EXOR gate 107 which receives the output signal of AND gate 106 and ready signal REDY; a flip-flop 108 which captures and outputs the output signal of EXOR gate 107 in response to the rise of count trigger signal CNTRG; and a flip-flop 109 which captures and outputs the output signal of flip-flop 108 in response to the fall of count trigger signal CNTRG.

Ready signal REDY is outputted from flip-flop 108, and a delayed ready signal REDYD is outputted from flip-flop 109. Flip-flops 108 and 109 are initialized in accordance with reset signal ZRST, and output the H level signals in the initial state.

Count trigger signal CNTRG is outputted from gate circuit 110 that receives delayed ready signal REDYD and the output signal of gate circuit 102. When the output signal of gate circuit 102 attains the L level while ready signal REDYD is at the H level, count trigger signal CNTRG is driven to the H level. Therefore, when delayed ready signal REDYD is at H level, gate circuit 110 functions as an inverter, and inverts the output signal of gate circuit 102. When delayed ready signal REDYD attains the L level, the output signal of gate circuit 110 is fixed to L level.

Figure 18:
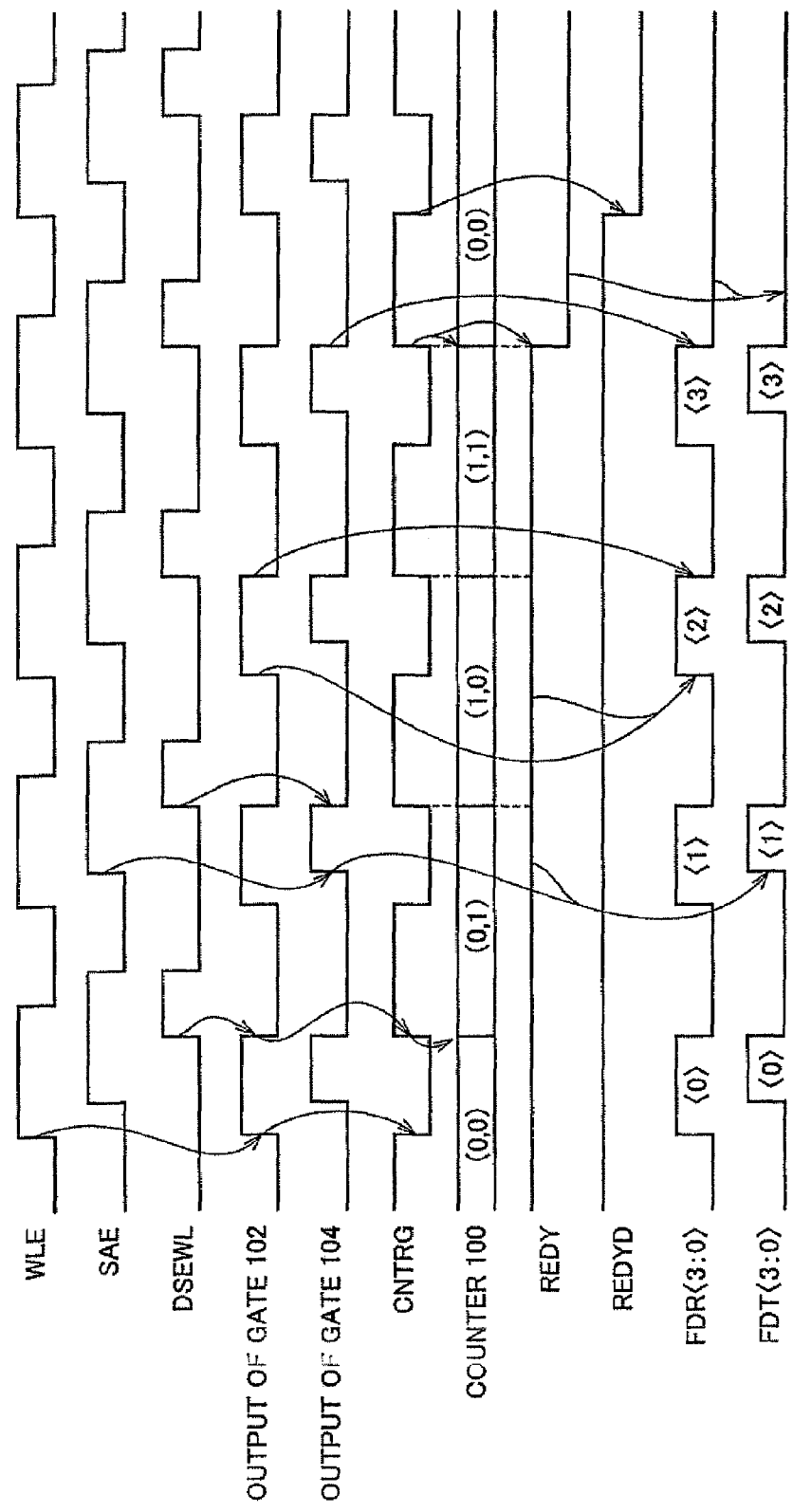
FIG. 18 is a timing chart representing an operation of circuitry shown in FIG. 17.

FIG. 18 is a timing chart representing the operation of fuse data read/capture signal generation unit shown in FIG. 17. The operation of the circuit shown in FIG. 17 will now be described in the following with reference to FIG. 18.

The count value of 2-bit binary counter 100 is reset to (0, 0) by reset signal ZRST.

Flip-flops 108 and 109 are initialized to a set state, and ready signal REDY and delay ready signal REDYD are both at H level.

Decoder 101 decodes the output bits <1:0> of 2-bit binary counter 100. Therefore, in the first cycle, the output signal <0> of the decoder is at an H level and the remaining 3 bits <3:1> are at an L level.

In an initializing sequence, when an auto fresh command is supplied, word line enable signal WLE, sense amplifier enable signal SAE, and word line disable signal DSEWL are driven to the H level sequentially in a predetermined sequence. Gate circuit 102 outputs an H level signal while word line enable signal WLE is at H level and word line disable signal DSEWL is at L level. Gate circuit 104 outputs an H level signal while sense amplifier enable signal SAE is at H level and word line disable signal DSEWL is at L level.

Therefore, fuse data read signal FDR<0> is driven to the H level by AND circuit 103 in accordance with the output signal of decoder 101 and the output signal of gate circuit 102, in response to the rise of word line enable signal WLE. The remaining fuse data read signals FDR<3:1> are kept at L level. Consequently, the storage data (program redundancy data) of column redundancy data storage circuit 62d shown in FIG. 12 are transferred to redundancy data hold circuit 66b via fuse data transfer bus 60.

When sense amplifier enable signal SAE is activated, the output signal of gate circuit 104 attains the H level, and accordingly, fuse data capture signal FDT<0> from AND circuit 105 attains the H level. As a result, column data hold circuit 66b shown in FIG. 13 captures the transferred redundancy data.

When word line disable signal DSEWL rises to the H level, the output signals of gate circuits 102 and 104 fall to the L level, fuse data read signal FDR<0> and fuse data capture signal FDT<0> attain the L level, and the transfer and capture of redundancy data complete.

When the output signal of gate circuit 102 falls to the L level, since delayed ready signal REDYD is at H level, count trigger signal CNTRG from gate circuit 110 rises to the H level, and the count of 2-bit binary counter 100 is incremented by 1 so as to assume (0, 1). Consequently, the output bit <1> of decoder 101 is driven to the H level.

Each time an auto refresh command is applied, the same operation is carried out. Specifically, in each cycle of performing auto refresh, fuse data read signals FDR<1> and FDR<2> are activated sequentially, and fuse data capture signals FDT<1> and FDT<2> are also activated, and responsively, the transfer, capture and holding of row redundancy data are performed.

When the count of 2-bit binary counter 100 reaches (1, 1) and auto refresh command is applied further, in accordance with the count (1, 1) of binary counter 100, fuse data read signal FDR<3> and fuse data capture signal FDT<3> are driven to an active state in accordance with the activation of word line enable signal WLE and sense amplifier enable signal SAE, respectively, and responsively, column redundancy data are transferred and captured.

When the transfer of column redundancy data to column redundancy data hold circuit 66a shown in FIG. 12 is completed, count trigger signal CNTRG is activated and 2-bit binary counter 100 performs counting operation, thereby changing the count from (1, 1) to (0, 0).

When the count of 2-bit binary counter 100 is (1, 1), the output signal of AND gate 106 is at H level and the output signal of EXOR gate 107 is at L level. Consequently, in response to the rise of count trigger signal CNTRG, the output signal of flip-flop 108, that is, ready signal REDY falls to an L level in accordance with the output signal of EXOR gate 107.

When auto refresh command is applied further and auto refresh of the fifth time is performed in the initializing sequence, count trigger signal CNTRG falls to the L level in accordance with the activation of word line enable signal WLE. In response to the fall of count trigger signal CNTRG, flip-flop 109 drives delayed ready signal REDYD to the L level in accordance with the output signal of flip-flop 108. Since ready signal REDY is already at the L level, in the fifth-time auto refresh, the output signals of gate circuits 102 and 104 are at the L level. Therefore, fuse data read signals FDR<3:0> are all at the L level and fuse data capture signals FDT<3:0> are also all at the L level, and transfer of redundancy data is not carried out. When delayed ready signal REDYD attains the L level, count trigger signal CNTRG outputted from gate circuit 110 is fixed to the L level and 2-bit binary counter 100 stops counting operation, thereby fixing the count at the initial value (0, 0).

Flip-flops 108 and 109 are each composed of, e.g. cascaded latch circuits of two stages. For example, flip-flop 108 captures the output signal of EXOR gate 107 when counter trigger signal CNTRG is at the L level, and outputs the captured signal when count trigger signal CNTRG attains the H level. Similarly, flip-flop 109 captures the output signal of flip-flop 108 when counter trigger signal CNTRG is high, and outputs the captured signal when count trigger signal CNTRG attains the L level.

In parallel with the auto refresh performed in the initializing sequence at the start-up, fuse data read signals FDR<3:0> and fuse data capture signals FDT<3:0> are generated to transfer and hold redundancy data. Thus, there is no need to provide a special cycle for the transfer/hold of the redundancy data, to simplify the initializing sequence.

The read of redundancy data held in the redundancy data hold circuits in the normal operation mode is performed in the same manner as in the first embodiment.

As described above, according to the second embodiment of the present invention, row and column redundancy data storage elements (fuse elements) are arranged outside the corresponding memory cell arrays, and transferred to the corresponding redundancy data hold circuits in the initializing sequence. Therefore, fuse elements, above which no interconnection line is permitted to be laid out, can be arranged outside the memory cell arrays, and a number of fuse elements can be arranged efficiently in the row/column fuse bands without being affected by other interconnection layout.

No fuse elements arranged in decoder band DBD eliminate the presence of interconnection inhibited area, thereby facilitating interconnection layout to arrange the circuits efficiently.

Similarly to the first embodiment, in the normal operation mode, redundancy data are transferred to the column spare decoder band in the period (tRCD) from a row access operation of selecting a row to a column access for column selection. As a result, even when the configuration of memory cell arrays is modified, the number of fuse program circuits (redundancy data storage circuits) is automatically changed, thereby preventing the presence of unnecessary redundancy data storage circuits so as to suppress an area increase. Since no fuse elements are arranged in the data path, interconnection layout is facilitated.

Third Embodiment

Figure 19:
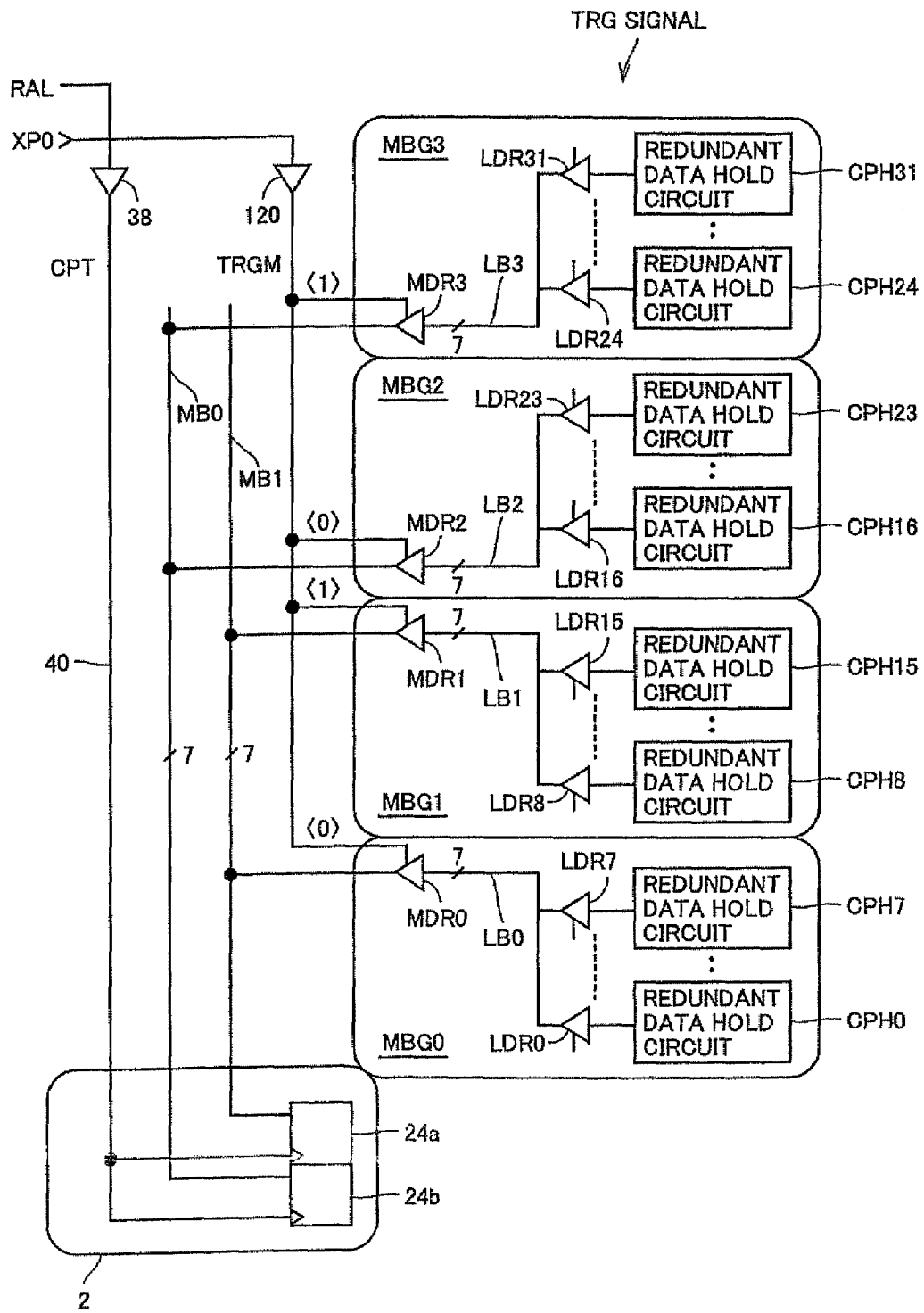
FIG. 19 schematically shows a configuration of a main part of a semiconductor memory device according to a third embodiment of the present invention.

FIG. 19 schematically shows a configuration of a main part of a semiconductor memory device according to a third embodiment of the present invention. FIG. 19 shows a configuration of one column redundancy data hold circuit band.

In FIG. 19, thirty two memory cell blocks are arranged as in the second embodiment. Column redundancy data hold circuits CPH0 to CPH31 are arranged in correspondence to these memory cell array blocks. Redundancy data hold circuits CPH0 to CPH31 are divided into four hold circuit groups MBG0 to MBG3. Hold circuit group MBG0 includes column redundancy data hold circuits CPH0 to CPH7, hold circuit group MBG1 includes column redundancy data hold circuits CPH8 to CPH15, hold circuit group MBG2 includes column redundancy data hold circuits CPH16 to CPH23, and hold circuit group MBG3 includes column redundancy data hold circuits CPH24 to CPU31.

Redundancy data hold circuits CPH0 to CPH31 are coupled to transfer circuits LDR0 to LDR31. Hold circuit groups MBG0 to MBG3 have local buses LB0 to LB3 arranged therein, respectively. Local buses LB0 to LB3 are driven by the corresponding transfer circuits. Transfer circuits LDR0 to LDR7 selectively drive local bus LB0, and local bus LB1 is selectively driven by transfer circuits LDR8 to LDR15. Local bus LB2 is selectively driven by transfer circuits LDR16 to LDR23. Local bus LB3 is selectively driven by transfer circuits LDR24 to LDR31.

Transfer circuits LDR0 to LDR31 are selectively activated by a signal generated based on a block selection signal that designates a memory cell array block as in the first embodiment.

Main bus drivers MDR0 to MDR3 are arranged to local buses LB0 to LB3. Main bus drivers MDR0 and MDR2 are activated, when main bus trigger signal TRGM<0> is set to an H level, to drive main buses MB1 and MB0, respectively. Main bus drivers MDR1 and MDR3 are activated when main bus trigger signal TRGM<1> is at the H level, to drive main buses MB1 and MB0, respectively. The main bus trigger signals TRGM<1:0> are generated based on the most significant row address predecode signal XP, and are transferred by buffer circuit 120 along the column direction.

Main buses MB1 and MB0 are similarly arranged in the column direction and coupled to column redundancy data hold circuits 24a and 24b included in column spare decoder band 2. Capture signal CPT is applied to column redundancy data hold circuit 24a and 24b from buffer (drive circuit) 38 via capture signal line 40. Capture signal CPT is generated based on row address latch signal RAL as in the first embodiment. Capture signal CPT and main bus trigger signal TRGM are maintained in an inactive state when refresh instruction signal /REF and burn-in signal /WBI are activated.

In the configuration shown in FIG. 19, the operation of transferring the redundancy data stored in column redundancy data hold circuits CPH0 to CPH31 is substantially the same as in the first embodiment. However, forming the redundancy data transfer paths into the hierarchical structure of local buses LB0 to LB3 and main buses MB0 and MB1 can reduce the load of main buses MB0 and MB1, and can transfer redundancy data at high speed. Therefore, where the redundancy data transfer paths are prolonged because of the provision of 32 memory cell array blocks, these redundancy data can be transferred at high speed.

Similarly to the first embodiment, the direction of transferring capture signal CPT and the direction of transferring redundancy data are made the same, and also made the same as the direction of transferring trigger signal TRGM. Accordingly, a sufficient margin can be secured for setup/hold timing with respect to the capturing operation in column redundancy data hold circuits 24a and 24b.

As described above, according to the third embodiment of the present invention, the redundancy data transfer unit for transferring redundancy data to the column spare decoder bands is formed into a local/main hierarchical structure. Where the redundancy data transfer paths are made longer, column redundancy data can be transferred at high speed, to transfer and hold column redundancy data within the time tRCD.

Similarly to the first embodiment, redundancy data can be captured with an adequate margin by coinciding the direction of transferring the capture signal with the direction of transferring main bus trigger signal TRGM, as the setup/hold requirements can be ensured for capturing of redundancy data with sufficient margin.

Fourth Embodiment

Figure 20:
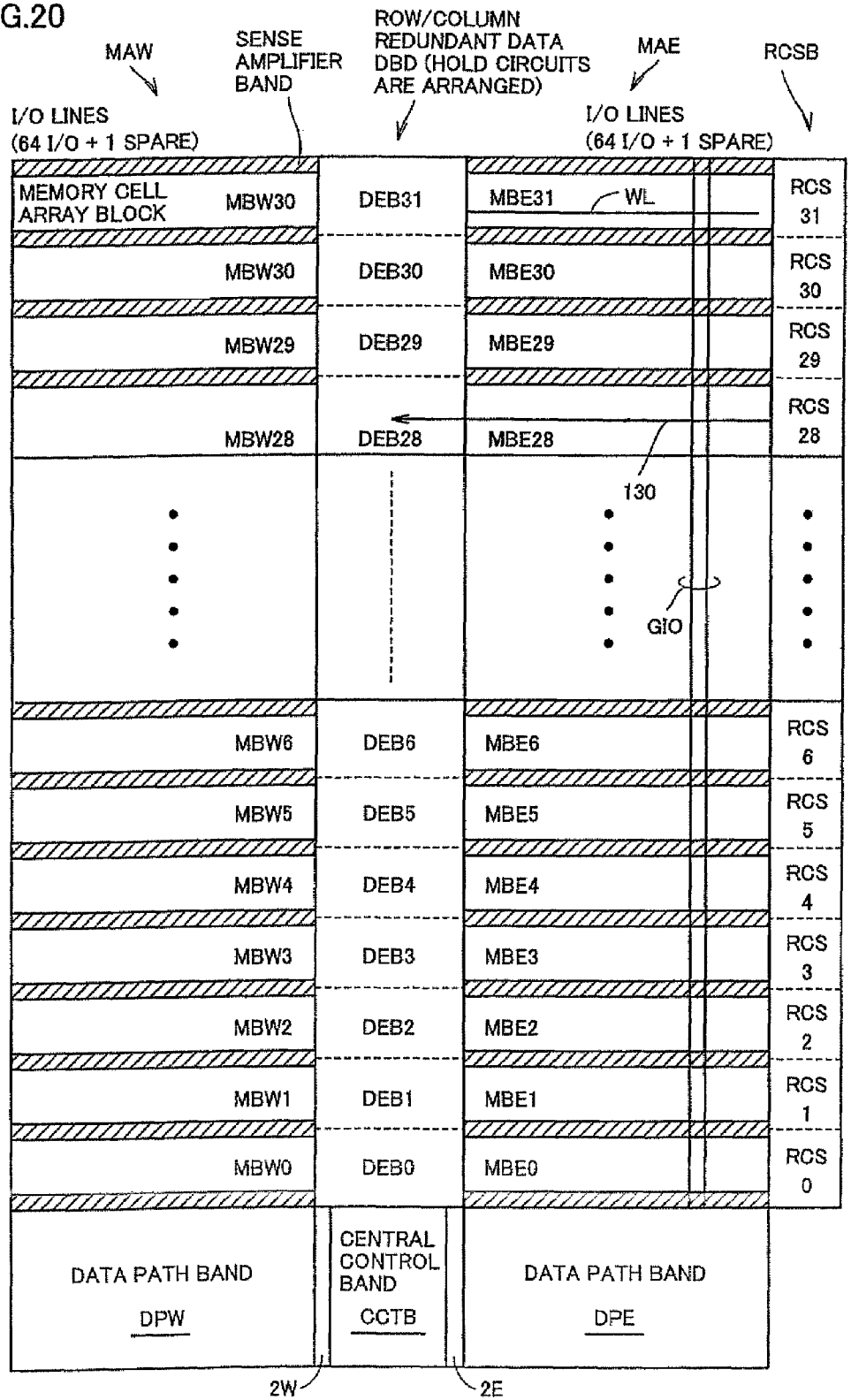
FIG. 20 schematically shows an entire configuration of a semiconductor memory device according to a fourth embodiment of the present invention.

FIG. 20 schematically shows an entire configuration of a semiconductor memory device according to a fourth embodiment of the present invention. In FIG. 20, row/column fuse band RCSB is arranged outside memory cell array MAE. Row/column fuse band RCSB is divided into 32 fuse blocks RCS0 to RCS31 in correspondence to memory cell array blocks MBE0, MBW0 to MBE31, MBW31. The row/column redundancy data from fuse block RCS28 are transferred to a row/column redundancy data hold circuit arranged in decoder band DBD via a redundancy data transfer bus 130.

Since the column redundancy data hold circuits are provided in decoder band DBD, column spare decoder bands 2W and 2E are arranged at both sides of central control band CCTB. The other components shown in FIG. 20 are the same as those shown in FIG. 8; the corresponding components are referred to with the same reference characters and their detailed description will not be repeated.

Figure 21:
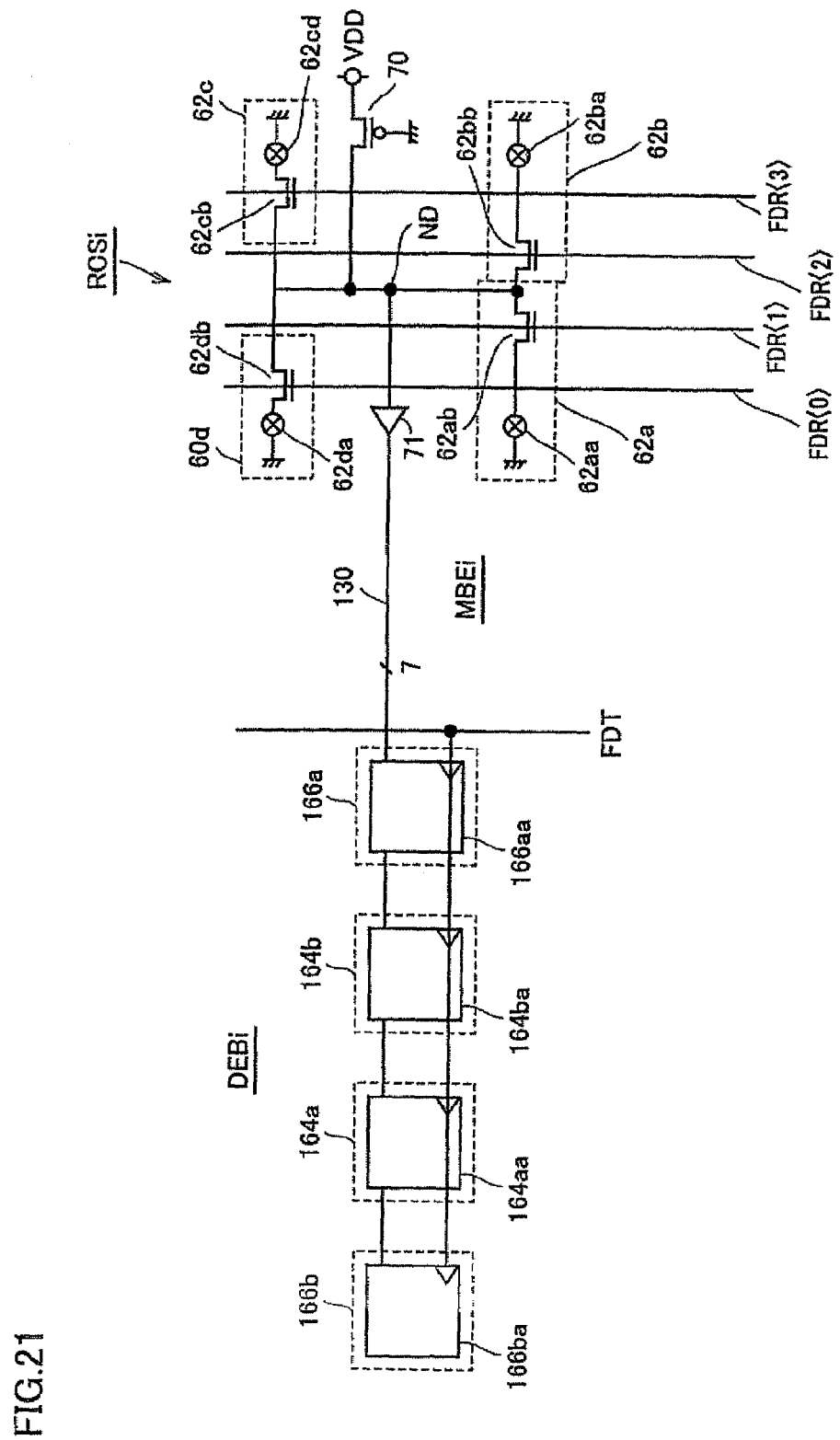
FIG. 21 shows an example of a configuration of a decoder block and row/column fuse block of the semiconductor memory device shown in FIG. 20.

FIG. 21 shows a configuration of row/column fuse block RCSi and one decoder block DEDi. FIG. 21 schematically shows a configuration of the part related to 1-bit redundancy data.

In FIG. 21, similarly to the second embodiment, row/column fuse block RCSi includes row redundancy data storage circuits 62a, 62b and column redundancy data storage circuits 62c, 62d. The configuration of redundancy data storage circuits 62a to 62d is the same as those arranged in row/column fuse block RCSi shown in FIG. 12, and the corresponding components are referred to with the same reference characters and their detailed description will not be repeated.

The redundancy data of the selected redundancy data storage circuit contained in row/column fuse block RCSi are transferred to decoder block DEBi through a fuse data (redundancy data) transfer bus 130, via drive circuit 71. Decoder block DEBi includes column redundancy data hold circuit 166b, row redundancy data storage circuits 164a, 164b and column redundancy data hold circuit 166a. Column redundancy data hold circuit 166b includes 7-bit flip-flop circuit 166be, row redundancy data hold circuit 164a includes 7-bit flip-flop circuit 164aa, row redundancy data storage circuit 164b includes 7-bit flip-flop circuit 164ba, and column redundancy data storage circuit 166a includes 7-bit flip-flop circuit 166aa.

These flip-flop circuits 166ba, 164aa, 164ba, and 166aa form a shift register which sequentially transfers holding data in accordance with capture signal FDT. Specifically, in fuse block RCSi, the redundancy data selected by fuse data read signals FDR<3:0> are sequentially transferred to and stored in flip-flop circuits 166aa, 164ba, 164aa, and 166ba.

Capture signal FDT and read signals FDR<3:0> shown in FIG. 21 are activated in parallel in the initializing sequence in performing auto refreshing. In this case, similarly to the second embodiment, a counter is used to count the number of times of refreshing for transferring redundancy data four times and inhibiting the transferring operation thereafter.

The operation of transferring redundancy data held in column redundancy data hold circuits 166b and 166a in the normal operation mode is the same as in any of the first to third embodiments.

Figure 22:
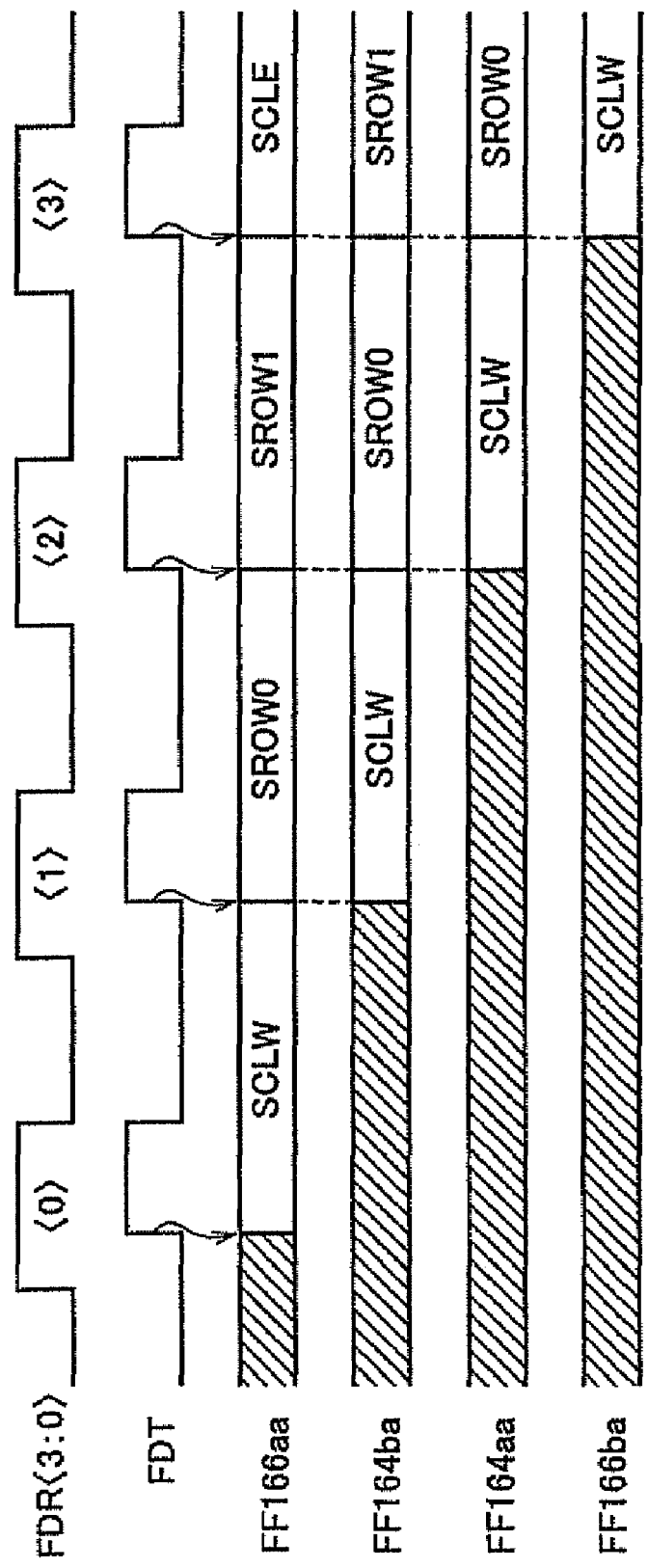
FIG. 22 is a timing chart representing a transfer operation of a circuit shown in FIG. 21.

FIG. 22 is a timing chart representing the operation of transferring redundancy data to the redundancy data hold circuits shown in FIG. 21. When redundancy data read signals FDR<3:0> are sequentially activated, redundancy data capture signal FDT is also activated. Column redundancy data SCLW, row redundancy data SROW0, SROW1, and column redundancy data SCLE are sequentially read from redundancy data storage circuits 62d, 62a, 62b, and 62c, respectively, in accordance with redundancy data read signals FDR<0> to FDR<3>. These are sequentially transferred to flip-flop circuits (FF) 166aa, 164ba, 164aa, and 166ba in accordance with fuse data capture signal FDT. Therefore, in activation of fuse data read signal FDR<1>, row redundancy data SROW0 are stored in flip-flop circuit 166aa, and column redundancy data SCLW with respect to memory cell array MBW are stored in flip-flop circuit 164ba.

When fuse data read signal FDR<2> is activated and capture signal FDT is activated row redundancy data SROW1 are stored in flip-flop circuit 166aa, row redundancy data SROW0 are stored in flip-flop circuit 164ba, and column redundancy data SCLW are stored in flip-flop circuit 164aa.

Finally, when fuse data read signal FDR<3> is activated and then fuse data capture signal FDT is activated, column redundancy data SCLE with respect to memory array block MBWi are stored in flip-flop circuit 166*aa*, row redundancy data SROW1 are stored in flip-flop circuit 164*ba*, row redundancy data SROW0 are stored in flip-flop circuit 164*aa*, and column redundancy data SCLW for memory cell array block MBWi are stored in flip-flop circuit 166*ba*. Therefore, when transfer operations of four times are completed, redundancy data hold circuits 166*a*, 164*b*, 164*a*, and 166*b* can store the corresponding redundancy data.

Figure 23:
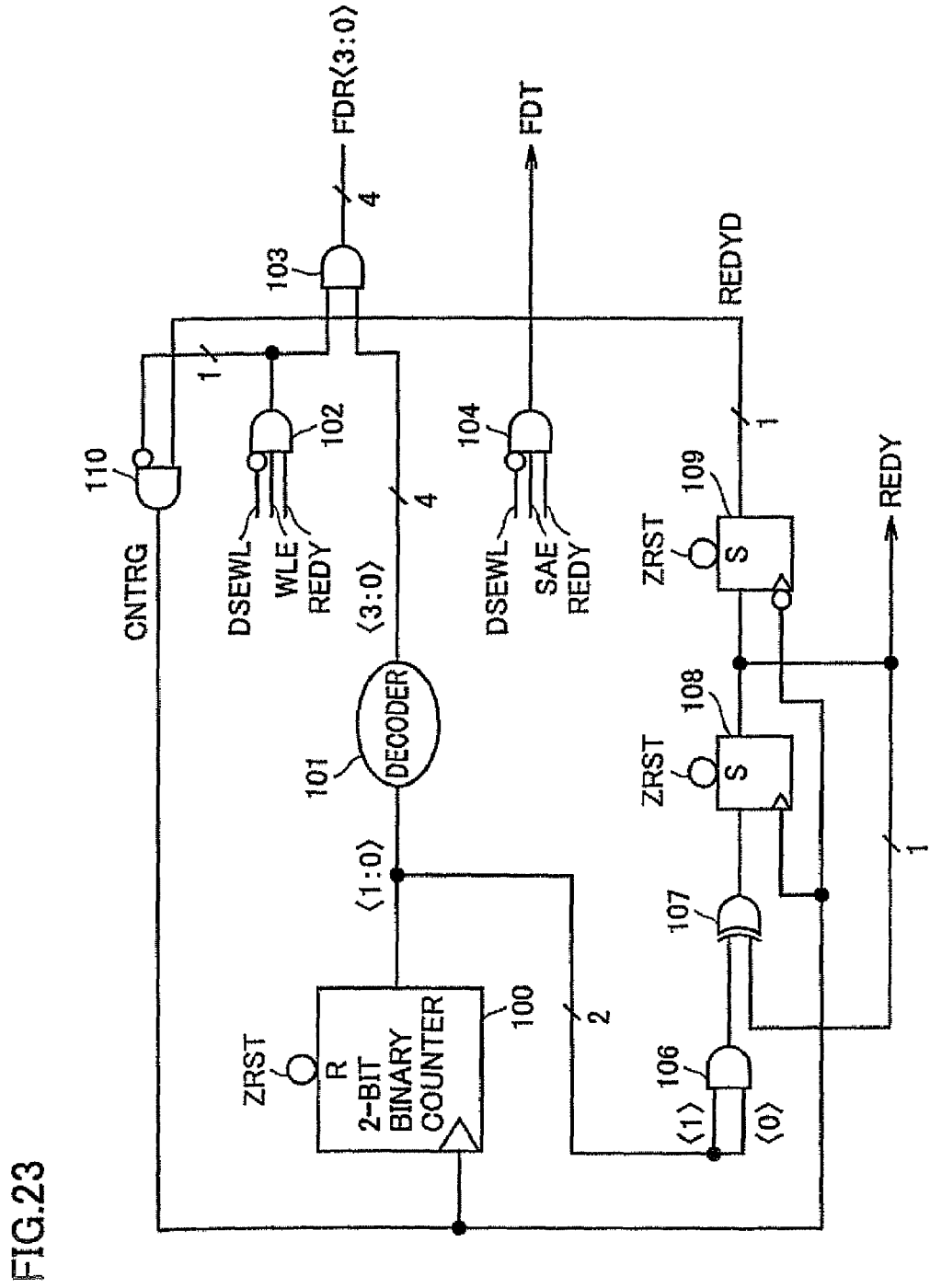
FIG. 23 schematically shows a configuration of a part for generating a fuse data read signal and fuse data capture signal shown in FIG. 21.

FIG. 23 shows a configuration of a part for generating fuse data read signals FDR<3:0> and capture signal FDT. The read/capture signal generation unit shown in FIG. 23 differs in configuration from the read/capture signal generation unit shown in FIG. 17 in the following points. That is, fuse data capture signal FDT is outputted from gate circuit 104 which receives word line disable signal DSEWL, sense amplifier enable signal SEAE and ready signal REDY. In order to capture fuse data (redundancy data), the operation of transferring redundancy data is merely performed and the output bits <3:0> of decoder 101 are not used. The other components are the same as those shown in FIG. 17, the corresponding components are referred to with the same reference characters and their detailed description will not be repeated.

In the configuration of read/capture signal generation unit shown in FIG. 23, as shown in the operational waveforms shown in FIG. 18, capture signal FDT is merely activated repeatedly in each transfer cycle, in place of capture signals FDT<3:0>. The same operation as the operation made by the circuitry shown in FIG. 17 is performed to set ready signal REDY to the L level after the completion of four transfer operations and to inhibit the transfer operations.

Figure 24:
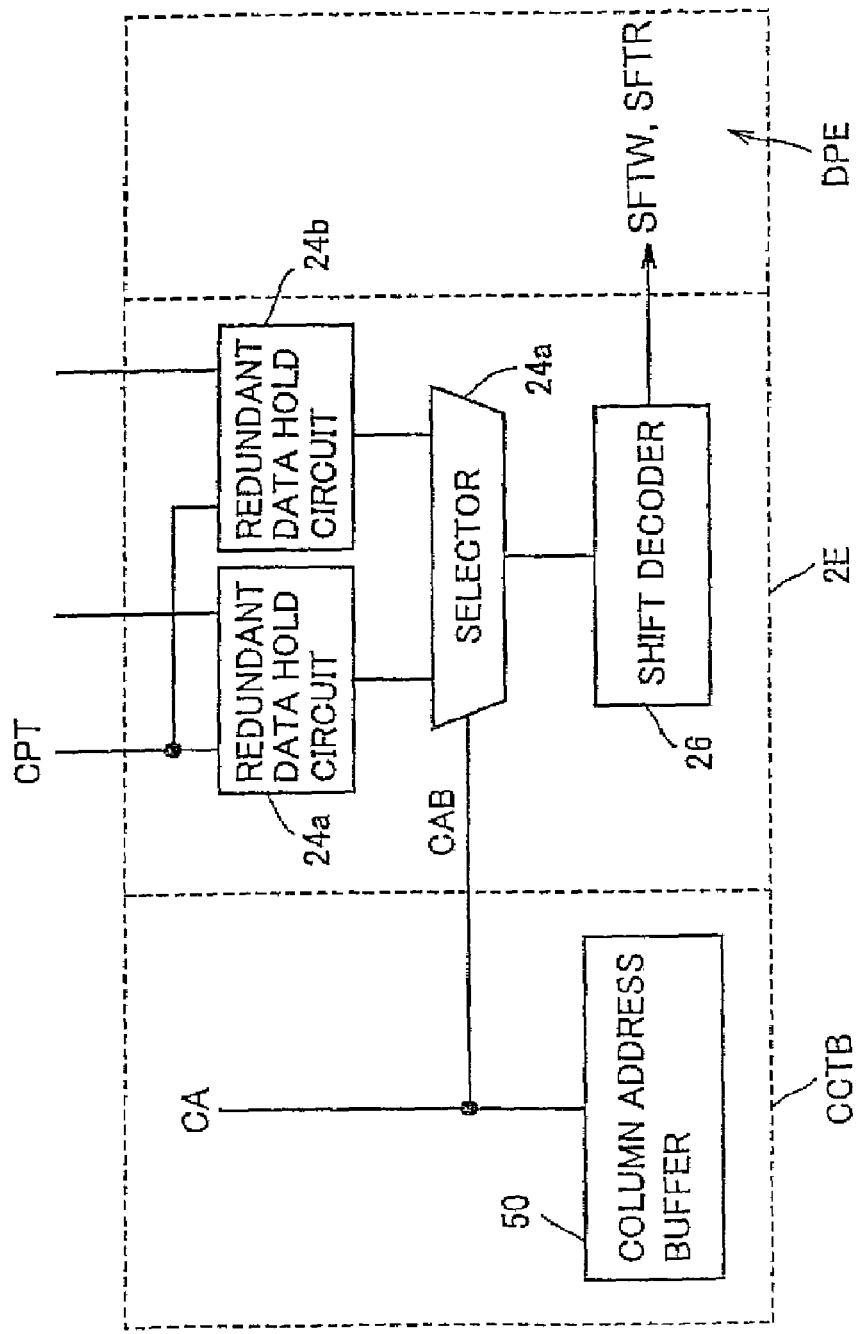
FIG. 24 schematically shows a configuration of a main part of a column spare decoder band and central control band shown in FIG. 20.
Figure 25:
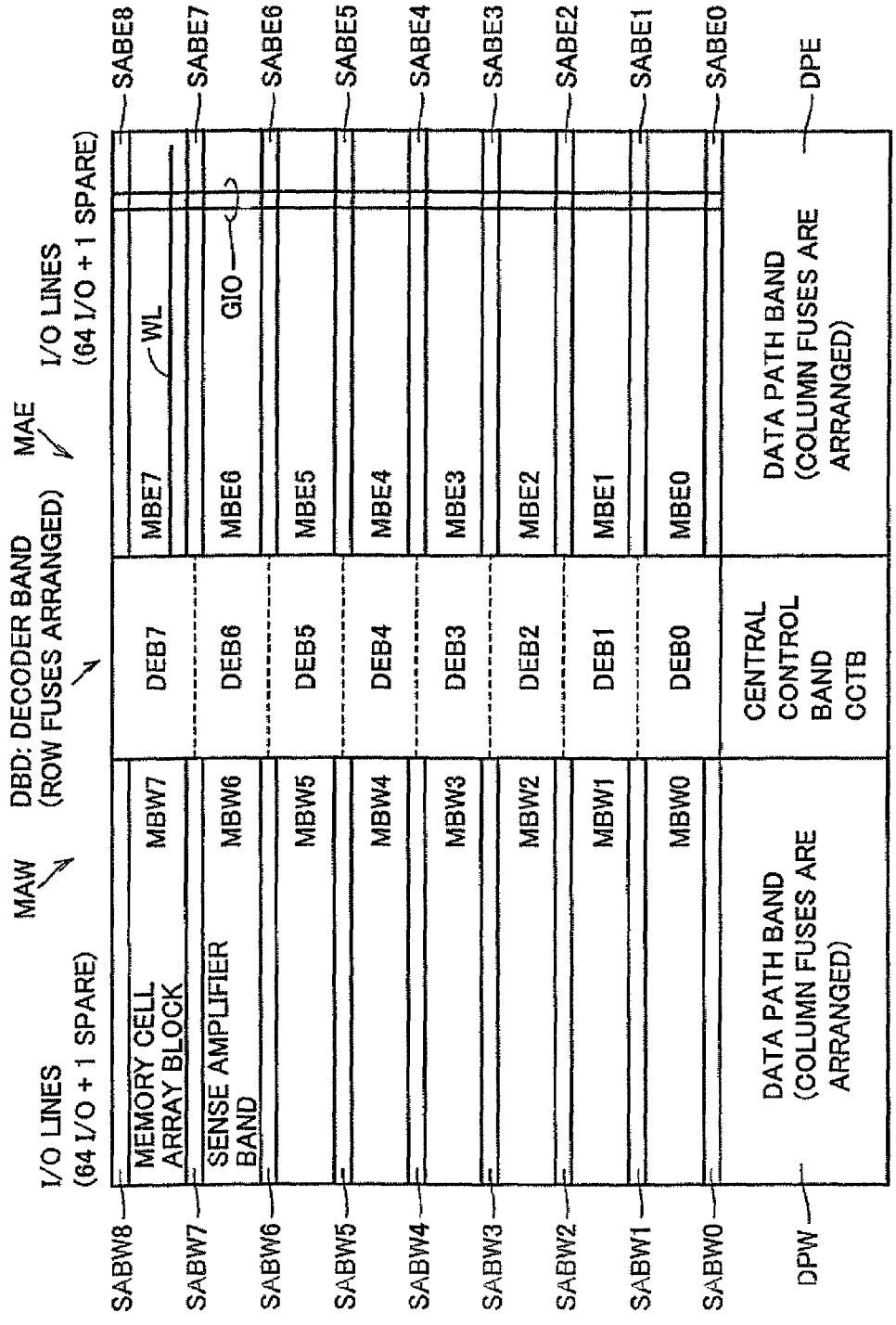
FIG. 25 schematically shows an entire configuration of a conventional semiconductor memory device.
Figure 26:
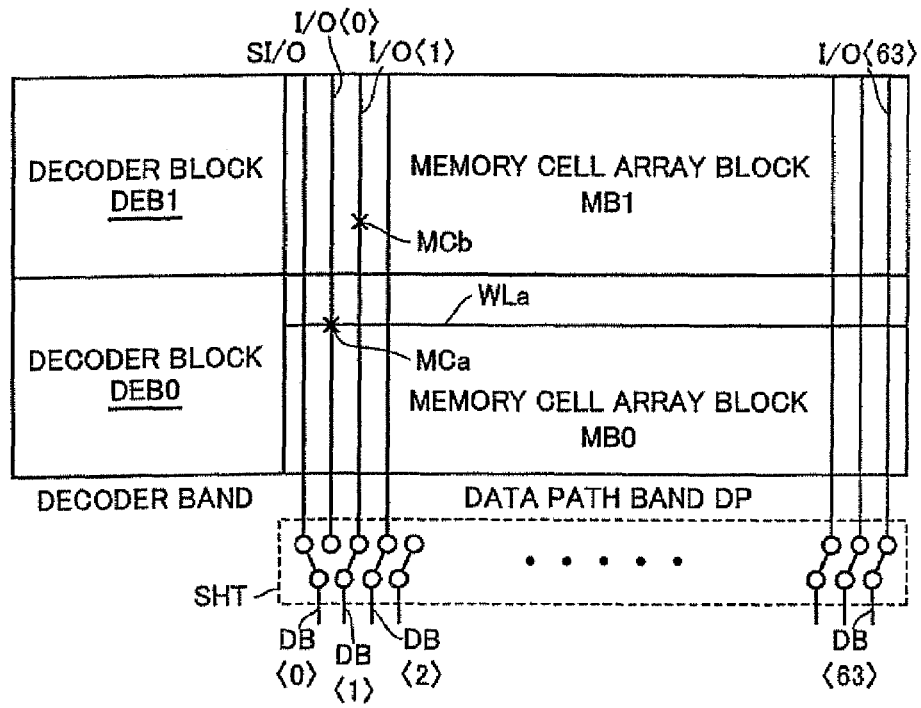
FIG. 26 illustrates defective column repairing in the conventional semiconductor memory device.
Figure 27:
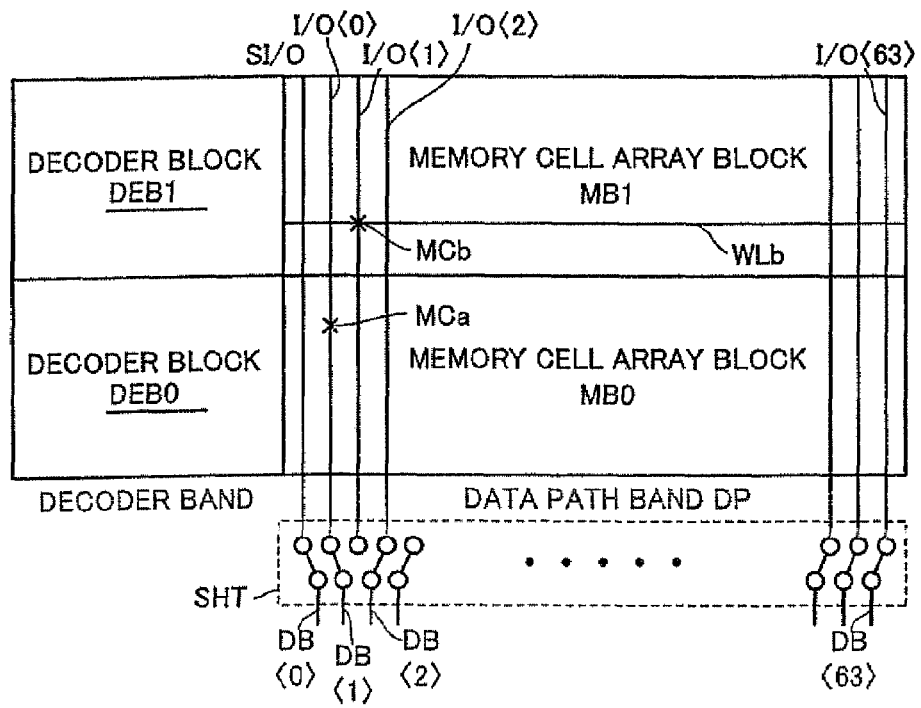
FIG. 27 illustrates the defective column repairing in the conventional semiconductor memory device.
Figure 28:
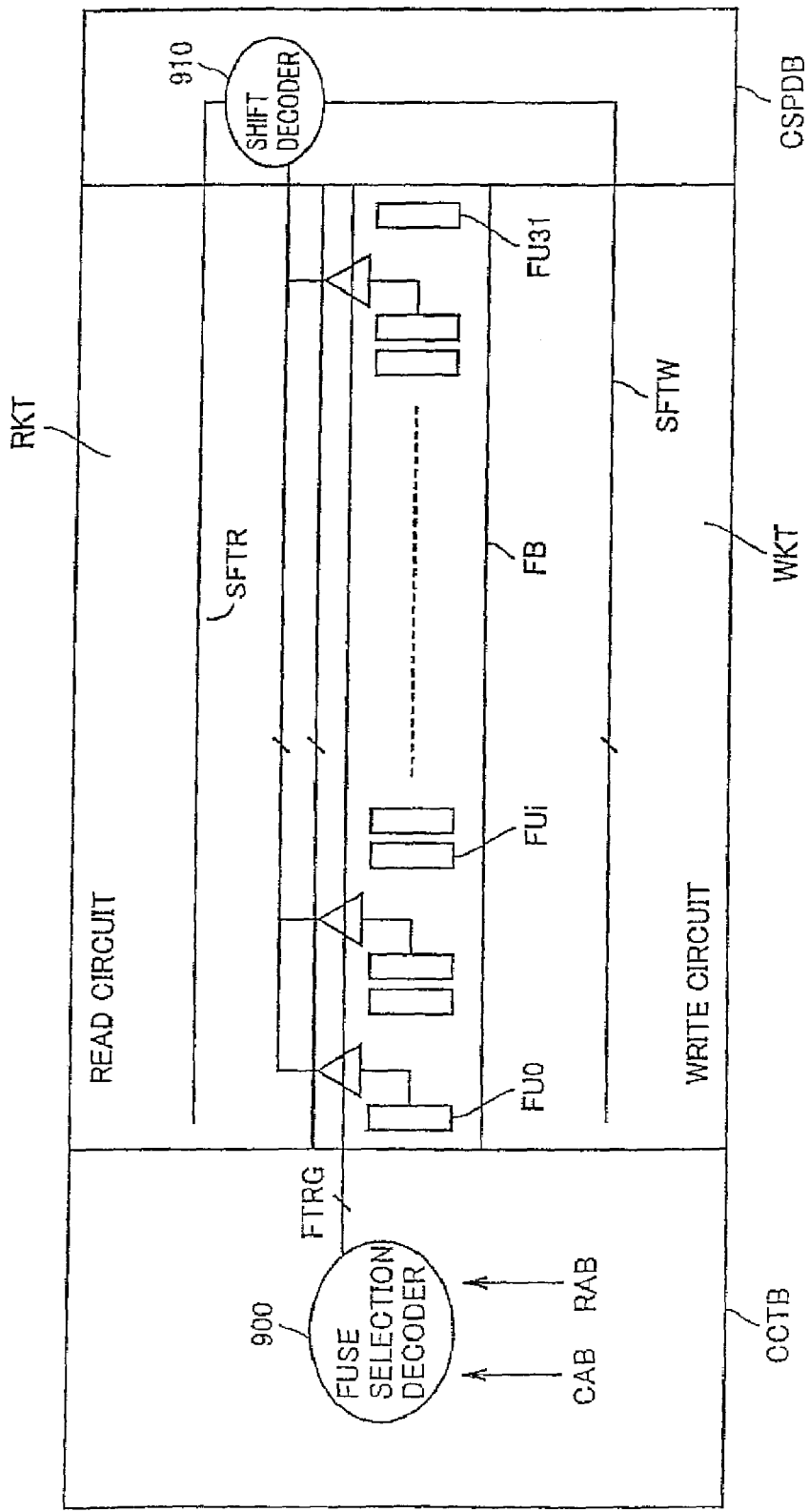
FIG. 28 schematically shows a configuration of a conventional column redundancy data generation unit.

FIG. 24 schematically shows a configuration of a main part of column spare decoder band 2E and central control band CCTB. Similarly to the first embodiment, spare decoder band 2E includes redundancy data hold circuits 24*a* and 24*b*, selector 25 which selects held data in one of redundancy data hold circuits 24*a* and 24*b* in accordance with page selection address bit CAB, and shift decoder 26 which decodes the redundancy data selected by selector 25 and generates shift signals SFTR and SFTW. The same configuration is provided in spare decode band 2W.

Central control band CCTB includes column address buffer 50 that generates column address signal CA in accordance with an external address signal. The most significant address bit CAB from column address buffer 50 is used as the page selection address bit. In this case, spare column decoder band 2E is arranged adjacent to central control band CCTB. Therefore, it is unnecessary to transfer the page selection address signal bit across data path band DPE to selector 25 in spare column decoder band 2E, and the output data of selector 25 can be set in a definite at faster timing, which enables I/O line pairs to be switched at a faster timing, thereby improving access time.

Switching of I/O line pairs is performed individually in each of data path bands DPE and DPW.

As described above, according to the fourth embodiment of the present invention, fuse elements which store row and column redundancy data are arranged outside the memory cell arrays to transfer the storage data to row and column redundancy data hold circuits arranged in the decoder bands in initialization. Therefore, fuse elements, above which interconnection cannot be laid out, can be concentrated outside the memory cell arrays, and fuse elements can be arranged regardless of the interconnection layout, to be able to arrange a number of fuse elements.

The decoder bands have only redundancy data hold circuits arranged therein and have no fuse elements arranged therein, which facilitates interconnection layout in the decoder bands. The row/column redundancy data storage/hold circuits are arranged in correspondence to memory cell array blocks, and in the normal operation, column redundancy data are transferred to the column spare decoder band in a period between row access and column access. Consequently, the number of redundancy data storage circuits is changed as the number of the memory cell array blocks is changed, preventing existence of unnecessary fuse elements to suppress an area increase.

In addition, the column spare decoder band can be arranged adjacent to the central control band, which eliminates the need for the transfer of page selection address across the data path, thereby reducing the access time.

In the above description, I/O line pairs are replaced according to shift redundancy scheme, to repair a defective cell. However, the present invention is applicable to the I/O replacement scheme where a pair of defective I/O lines is replaced by a pair of spare I/O lines. In place of a shift signal, an I/O line pair selection signal is generated to substitute the selected I/O line pair with a pair of spare I/O lines. The present invention is also applicable to semiconductor memory device of column selection line replacement scheme where a spare column replaces with a defective column.

The data lines transfer write data and read data via the I/O line pairs. However, the present invention is applicable to semiconductor memory device of separated I/O structure where the write data lines for transferring write data and the read data lines for transferring read data are separately provided.

As described above, according to the present invention, a plurality of redundancy data storage circuits, which store data on a defective column, are arranged physically corresponding to a plurality of memory array blocks. The number of redundancy data storage circuits is automatically changed as the number of the memory cell array blocks is changed, thereby preventing the presence of unnecessary redundancy data storage circuits, to suppress an area increase.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a plurality of memory array blocks, each block having a plurality of memory cells arranged in rows and columns;
a plurality of redundancy data storage circuits, distributively arranged, corresponding to and along regions having corresponding memory array blocks placed thereon, each data storage circuit individually storing redundancy data for specifying a defective column of a corresponding memory array block, each of the redundancy data storage circuits including (i) a program circuit for programming and storing the redundancy data of the corresponding memory array block and (ii) a hold circuit receiving and holding storage data of the program circuit, the program circuit and the hold circuit being arranged oppositely with respect to the corresponding memory array block; and
a plurality of row decoder circuits arranged in correspondence with the memory array blocks and on an opposite side of the corresponding memory array blocks from the corresponding redundancy data storage circuits for the corresponding memory array blocks, each row decoder circuit decoding a received address signal to select an addressed row in the corresponding memory array block.

2. A semiconductor memory device comprising:

a plurality of memory array blocks, each block having a plurality of memory cells arranged in rows and columns;

a plurality of redundancy data storage circuits, distributively arranged corresponding to and along regions having corresponding memory array blocks placed thereon, each data storage circuit individually storing redundancy data for specifying a defective column of a corresponding memory array block, each of the redundancy data storage circuits including a program circuit, located outside the region of a corresponding memory block, for programming and storing the redundancy data for the defective column of the corresponding memory array block; and a plurality of row decoder circuits arranged in correspondence with the memory array blocks and on an opposite side of the corresponding memory array blocks from the corresponding redundancy data storage circuits for the corresponding memory array blocks, each row decoder circuit decoding a received address signal to select an addressed row in the corresponding memory block.

3. The semiconductor memory device according to claim 2, wherein each redundancy data storage circuit further comprises a hold circuit receiving and holding storage data of the program circuit.

* * * * *